(12) United States Patent
Iino et al.

(10) Patent No.: US 7,228,204 B2
(45) Date of Patent: Jun. 5, 2007

(54) FAN UNIT FOR FORCED AIR COOLING, MOTHERBOARD FORMED WIRING FOR OPERATING FAN UNIT, AND ELECTRONIC EQUIPMENT TO BE FAN-COOLED

(75) Inventors: Kazuhiro Iino, Kawasaki (JP); Naoya Yamazaki, Kawasaki (JP); Takashi Shirakami, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 371 days.

(21) Appl. No.: 10/061,054

(22) Filed: Jan. 29, 2002

(65) Prior Publication Data

US 2003/0065426 A1    Apr. 3, 2003

(30) Foreign Application Priority Data

Sep. 28, 2001  (JP) .............................. 2001-302478

(51) Int. Cl.
  *G05D 25/00*    (2006.01)
  *G05D 13/00*    (2006.01)
  *G05B 5/02*     (2006.01)
  *H05K 7/20*     (2006.01)

(52) U.S. Cl. ........................... 700/300; 700/9; 700/28; 700/304; 702/130; 361/695

(58) Field of Classification Search ........ 700/276–278, 700/299, 300, 304, 9, 11, 12, 28, 32; 702/130, 702/136; 713/300–340; 361/695–697
See application file for complete search history.

(56) References Cited

U.S. PATENT DOCUMENTS

| 4,756,473 | A | * | 7/1988 | Takemae et al. ........... 236/49.3 |
| 5,102,040 | A | * | 4/1992 | Harvey ...................... 236/49.3 |
| 5,287,244 | A | * | 2/1994 | Hileman et al. ............ 361/687 |
| 5,906,315 | A | * | 5/1999 | Lewis et al. ................ 236/49.3 |
| 5,926,386 | A | * | 7/1999 | Ott et al. ...................... 700/70 |
| 6,101,459 | A | * | 8/2000 | Tavallaei et al. ............ 702/132 |
| 6,134,667 | A | * | 10/2000 | Suzuki et al. ............... 713/300 |
| 6,182,902 | B1 | * | 2/2001 | Shih ............................ 236/35 |
| 6,414,843 | B1 | * | 7/2002 | Takeda ....................... 361/687 |

* cited by examiner

*Primary Examiner*—Leo Picard
*Assistant Examiner*—Sean Shechtman
(74) *Attorney, Agent, or Firm*—Katten Muchin Rosenman LLP

(57) ABSTRACT

The present invention relates to a fan unit used for forced air cooling, a motherboard with predetermined wiring formed as a wiring pattern, disposed on the rear face of an equipment, and an electronic equipment provided with the fan unit and the motherboard. It is an object of the present invention to reliably maintain appropriate forced air cooling at low cost. For this purpose, the fan unit of the present invention measures temperatures of predetermined places in parallel, processes each of combinations of these temperatures, outputs the processing result via lines whose number is equal to the number of the combinations, and maintains the revolving speed of fans at a value suitable for the processing result obtained via these lines.

6 Claims, 12 Drawing Sheets

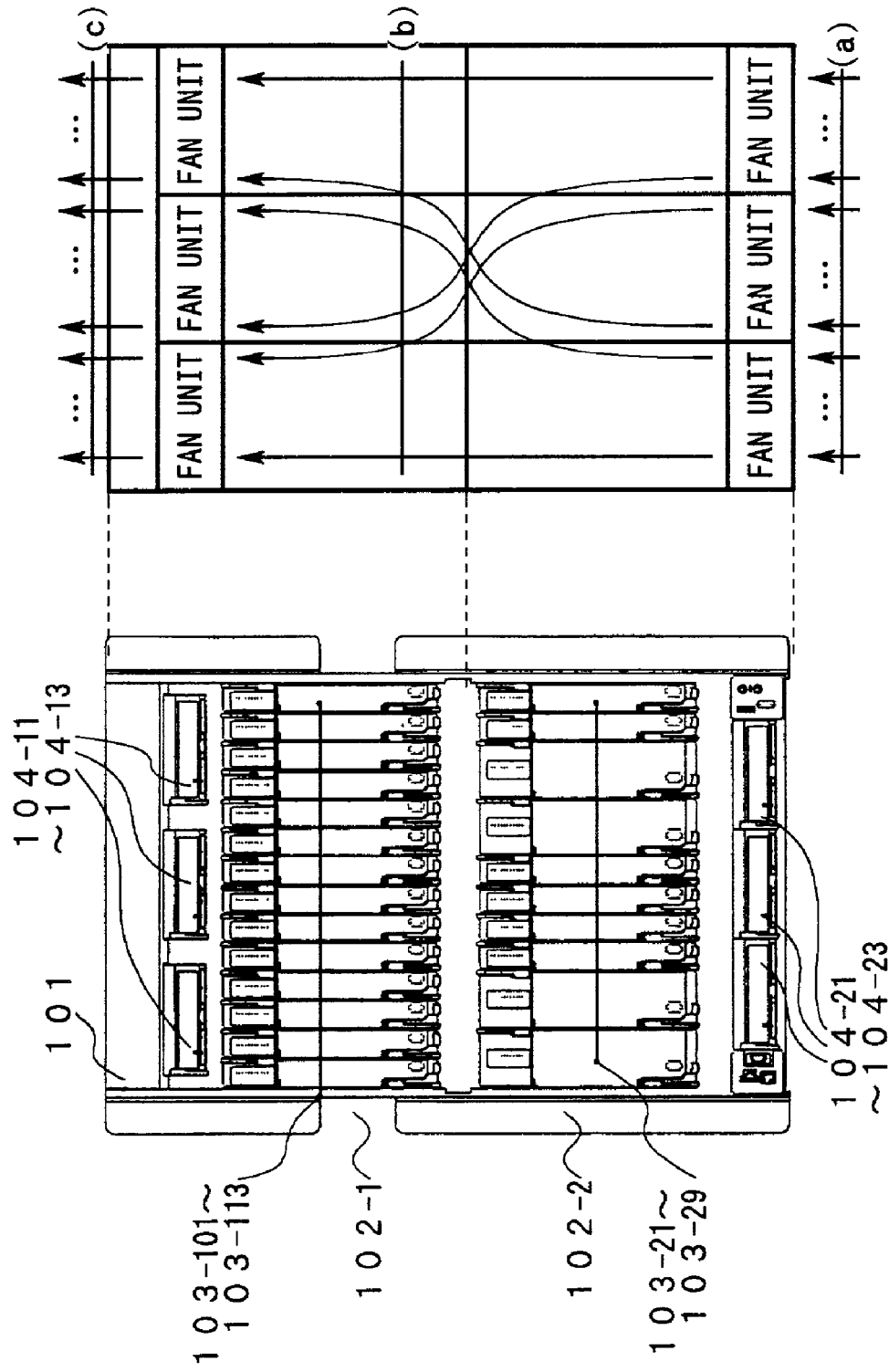

FAN UNIT FOR FORCED AIR COOLING, MOTHERBOARD FORMED WIRING FOR OPERATING FAN UNIT, AND ELECTRONIC EQUIPMENT TO BE FAN-COOLED

BACKGROUND OF THE INVENTION

1. Field of the Invention

The present invention relates to a fan unit having a fan which is used for forced air cooling of a desired equipment and performing predetermined processing for the temperature of an exterior or a predetermined place of the equipment to output the result of the processing; a motherboard provided on the rear face of a shelf or a rack on which the fan unit is disposed, with its wiring between the fan unit and a predetermined unit being formed as a wiring pattern; and an electronic equipment in which a plurality of the above-described fan units are provided and which is forcedly air-cooled by the fan units.

2. Description of the Related Art

In recent years, electronic equipments such as communication equipments and others have been low-priced and downsized and forced air cooling is applied to nodes adaptable to a wavelength-division multiplexing transmission system since precise temperature control and high-density mounting are severely demanded particularly for these nodes.

FIG. 10 is a view showing a structure example of a node to which the forced air cooling is applied.

In FIG. 10, shelves 102-1 and 102-2 are formed in a frame 101, and in slots in the shelves 102-1 and 102-2, packages 103-101 to 103-113 and 103-21 to 103-29 which operate based on predetermined functional distribution and load distribution are mounted respectively. In the upper part of the shelf 102-1 disposed are fan units 104-11 to 104-13, while in the lower part of the shelf 102-2 fan units 104-21 to 104-23 are disposed.

In the node as structured above, the fan units 104-11 to 104-13 and 104-21 to 104-23 are driven by the power supply steadily given thereto and the fan units 104-21 to 104-23 out of these fan units 104-11 to 104-13 and 104-21 to 104-23 blow air of an exterior of the frame 101 into the frame 101 (the shelves 102-1 and 102-2 (FIG. 10(a)).

The air thus blown in is warmed by heat generated in the packages 103-101 to 103-113 and 103-21 to 103-29 inside the frame 101 (the shelves 102-1 and 102-2) (FIG. 10(b)) and is radiated outside the frame 101 by the fan units 104-11 to 104-13 (FIG. 10(c)).

Therefore, highly reliable and stable forced air cooling is conducted for the packages 103-101 to 103-113 and 103-21 to 103-29 as long as the sum total of physical air quantities generated by the fan units 104-11 to 104-13 and 104-21 to 104-23 is sufficient.

Furthermore, all of the fan units 104-11 to 104-13 and 104-21 to 104-23 are structured as modules which are attachable and detachable via an identical connector, and therefore, the structure thereof is standardized and the number of spared components to be secured in the process of maintenance and operation is reduced.

Incidentally, in the above-described conventional example, the revolving speed of fans which are provided individually in the fan units 104-11 to 104-13 and 104-21 to 104-23 is set in advance at a value which enables radiation of a heat quantity larger than a ratio of the maximum heat quantity which is possible to be generated in all the packages 103-101 to 103-113 and 103-21 to 103-29, which are possible subjects of the forced air cooling, to the minimum number of the fan units which are possible to operate in parallel.

Consequently, the sum total of the air quantities of the fans which are provided in these fan units 104-11 to 104-13 and 104-21 to 104-23 secures sufficient allowance for calorific values of the packages 103-101 to 103-113 and 103-21 to 103-29, but it is often excessive.

Moreover, since physical moving mechanisms are provided in these fans, they have low reliability compared with electronic components and packages and make uselessly high level of noises even when power consumption by the packages 103-101 to 103-113 and 103-21 to 103-29 is small.

Consequently, not only reliability but also working environments in station offices have been degraded and restrictions on reduction in running cost have been caused.

Furthermore, when the fan units 104-11 to 104-13 and 104-21 to 104-23 are individually provided with temperature sensors and they independently vary the revolving speeds of their fans according to temperatures detected by the temperature sensors, the fan units 104-11 to 104-13 out of these fan units 104-11 to 104-13 and 104-21 to 104-23 independently increase the revolving speeds of their fans since the temperatures in these units are increased due to the heat radiated by the packages which are positioned under these units respectively.

However, even when the revolving speeds of a part of the fans are thus increased, an appropriate air quantity is not always obtainable unless the temperature sensors provided in the other fan units detect the aforesaid increase in temperature in parallel to increase the revolving speeds of the individual fans, and in addition, there is a high possibility that power supply is uselessly consumed by the plurality of fans.

Incidentally, the lack of the air quantity and the power consumption as mentioned above are avoidable by providing the following temperature sensor and control unit.

- a temperature sensor for individually measuring the temperature of a desired place
- a control unit which is structured separately from the fan units 104-11 to 104-13 and 104-21 to 104-23 and which plays a leading role in setting the revolving speed of the fans individually provided in these fan units 104-11 to 104-13 and 104-21 to 104-23 at a value suitable for the combinations of these temperatures However, the control unit as described above is complicated in its structure and large in its hardware scale, which is a factor to prevent a node from improving its total reliability and being downsized, and therefore, it has been difficult to apply the control unit in actual use.

SUMMARY OF THE INVENTION

It is an object of the present invention to provide a fan unit, a motherboard, and an electronic equipment in which appropriate forced air cooling based on load distribution is reliably achieved at low cost without complicating the structure.

It is another object of the present invention to maintain the revolving speed of fans provided in individual fan units at a value suitable for combinations of temperatures measured by these fan units without complicating the structure.

It is still another object of the present invention to lower the cost as well as to standardize the structure and to achieve forced air cooling of individual packages with high reliability.

It is yet another object of the present invention to standardize the structure and flexibly adapt to various numbers and layouts of fan units and packages to be mounted in an equipment.

Moreover, it is yet another object of the present invention to avoid structure complexity due to provision of an active circuit which is structured separately from fan units, and to lower the cost as well as to standardize the structure.

It is yet another object of the present invention to prevent stress due to a temperature increase given on a mechanism which is engaged in revolving a fan.

It is yet another object of the present invention to secure an air quantity necessary for forced air cooling based on load distribution.

Furthermore, it is yet another object of the present invention to standardize the structure and realize flexible adaptability to various numbers and layouts of mounted fan units and electronic circuits.

It is yet another object of the present invention to realize load distribution and functional distribution by fan units mounted together with the fan unit of the present invention in an equipment.

It is yet another object of the present invention to compensate for an air quantity which a failed fan is to originally secure and which is to be used for forced air cooling, by other normally operating fan units.

It is yet another object of the present invention that when the fan unit of the present invention is dismounted in the process of maintenance, operation, and other works, other fan units equipped together with this fan unit in the same equipment are able to recognize the state and compensate for shortfall in air quantity.

Furthermore, it is yet another object of the present invention to recognize the state that any of fan units equipped together with the fan unit of the present invention in the same equipment is dismounted, and to compensate for a shortfall in air quantity to be used for forced air cooling.

It is yet another object of the present invention to further standardize the structure.

Moreover, it is yet another object of the present invention to achieve an improvement in reliability as well as cost reduction and structure standardization.

The above-described objects are achieved by a fan unit which measures temperature(s) of a single place or a plurality of places; performs processing for each of combinations of the measured temperatures, the combinations consisting of temperatures in number n equal to or smaller than the number of all of the measured temperatures; notifies the processing result to an exterior via lines whose number m is equal to or smaller than the number n; and maintains the revolving speed of a fan at a value determined in advance correspondingly to the processing result notified from the exterior via these lines.

According to the fan unit as structured above, even when the plurality of fan units are mounted, broadcasting sections and controlling sections provided individually in these fan units can realize the processing for computing the revolving speed of the fans also individually provided in the fan units as distributed processing by cooperating with each other via the lines which are m in number smaller than the number n of the temperatures to be subjects of the processing.

Furthermore, this distributed processing is achieved without provision of an active circuit structured separately from the plurality of fan units, on the lines.

The above-described objects are also achieved by a fan unit which sets the revolving speed of the fan at a prescribed value when any of the measured temperatures is higher than a predetermined upper limit value.

According to the fan unit as structured above, the revolving speed of the fan is set at the prescribed value when the temperature increases to the upper limit value which is too high to maintain the revolving speed of the fan.

The above-described objects are also achieved by a fan unit which notifies the exterior via any of the lines that the revolving speed of the fan is set at a value equal to or lower than the prescribed value, during a period when the speed is set at the value.

According to the fan unit as structured above, it is possible to compensate, by other fan units connected thereto via the lines, for a shortfall in air quantity which occurs due to a decrease in the revolving speed of the fan provided in the fan unit and which is to be used for predetermined forced air cooling.

The above-described objects are also achieved by a fan unit which comprises a section used for setting connection and disconnection between a section for giving the aforesaid notification and the lines.

In an equipment provided with the fan unit having the above structure, the revolving speed of the fan for blowing air necessary for forced air cooling can be determined according to any of the processing results obtained by the broadcasting section provided in this fan unit and by some other section.

The above-described objects are also achieved by a fan unit in which the section for giving the aforesaid notification and a section for maintaining the revolving speed of the fan are both connected with the lines, and the section for giving the notification includes a section used for determining permission and rejection of the operation of the section for giving the notification.

In an equipment provided with the fan unit having the above structure, the revolving speed of the fan for blowing air necessary for forced air cooling can be determined according to any of the processing results obtained by the broadcasting section provided in this fan unit and by some other section.

The above-described objects are also achieved by a fan unit which computes the sum of the temperatures in each of the combinations and notifies the computed sum to the exterior via a corresponding line among the lines by sending a signal signifying that the computed sum is added to the sum of temperatures notified in parallel on the line by fan units other than this fan unit.

In an equipment having a plurality of fan units including the above fan unit, an air quantity used for forced air cooling is appropriately set by the plurality of fan units which cooperate with each other via the lines, even when it is not univocally determined by a single temperature measured in any of the fan units.

The above-described objects are also achieved by a fan unit which computes the sum of the temperatures in each of the combinations by weighting according to a weight determined in advance.

In an equipment having the plurality of fan units including the above fan unit, an air quantity used for forced air cooling is appropriately updated according to a desired rate of change relative to each temperature measured by a part or all of the fan units.

The above-described objects are also achieved by a fan unit which appends, when a failure is detected, a status indicating the failure detection, to the processing result to be notified to the exterior via any of the lines.

According to the fan unit as structured above, it is surely recognized by fan units mounted together with this fan unit in the same equipment that the fan unit has a failure.

The above-described objects are also achieved by a fan unit which appends information indicating that the fan unit is mounted, to the result of the processing to be notified to the exterior via any of the lines.

In the fan unit as structured above, when the fan unit of the present invention is dismounted in the process of maintenance, operation, and other works, other fan units equipped together with this fan unit in the same equipment are able to recognize the state and compensate for shortfall in air quantity.

The above-described objects are also achieved by a fan unit which sets the revolving speed of the fan at a predetermined large value when the processing result to be notified via any of the lines is not identifiable, the processing result signifying that some fan unit to be connected via the lines is mounted.

According to the fan unit as structured above, it is possible to recognize the state that any of fan units equipped together with the fan unit of the present invention in the same equipment is dismounted, and to compensate for a shortfall in air quantity to be used for forced air cooling.

The above-described objects are also achieved by a fan unit which measures all the temperatures to be possible subjects of the measurement, among a free air temperature and the temperature(s) of the single place or the plurality of places in an equipment provided with the fan unit; selects a temperature to undergo some processing from the measured temperatures; and performs the processing.

In the equipment in which the fan unit as structured above is mounted, the temperature is measured, flexibly adapting to various structures of the equipment.

The above-described objects are also achieved by a fan unit which maintains thermal coupling of individual places or directions to be subjects of temperature measurement and a temperature sensor, and includes a section used for physical switching-over of these places or directions.

In the equipment in which the fan unit as structured above is mounted, the temperature can be measured flexibly adapting to various structures of the equipment.

The above-described objects are also achieved by a motherboard which comprises: wiring formed as a wiring pattern and connected with either of a plurality of fan units according to the present invention and packages to be forcedly air-cooled by these fan units; and wiring formed as a wiring pattern together with the above wiring and corresponding to a bus-shaped line, for connecting a broadcasting section provided in a specific fan unit among the plurality of fan units, with controlling sections individually provided in all the rest of the fan units except the specific fan unit.

In an equipment provided with the above motherboard and the plurality of fan units described, broadcasting sections and the controlling sections provided individually in these fan units can cooperate with each other via the second wiring which is formed in advance as a wiring pattern.

The above-described objects are also achieved by a motherboard which comprises: wiring formed as a wiring pattern and connected with any of a plurality of fan units according to the present invention and packages to be forcedly air-cooled by these fan units; wiring formed as a wiring pattern together with the above wiring and corresponding to a bus-shaped line, for connecting a specific broadcasting section among broadcasting sections provided individually in the plurality of fan units, with all or a part of controlling sections provided individually in these fan units; and a connector element used for selecting the broadcasting section to be connected with the wiring from the broadcasting sections.

In an equipment provided with the motherboard and the plurality of fan units, a fan unit to distribute 'a processing result relating to determining the revolving speed of a fan' to the other fan units via the lines can be flexibly selected from these fan units according to settings of the connector element.

The above-described objects are also achieved by a motherboard in which wiring used for connection with a thermometry section which is not provided in any of the plurality of fan units is also formed as a wiring pattern.

An equipment having the motherboard and the aforesaid fan units which performs forced air cooling can be structured without any additional wiring used for connection with the aforesaid thermometry section, even when an air quantity necessary for the forced air cooling is determined according to not only temperatures measured by thermometry sections individually provided in these fan units but also temperatures measured by the aforesaid thermometry section.

The above-described objects are also achieved by an electronic equipment which comprises: a plurality of fan units cooperating with each other via wiring laid in a bus shape and having the same structure as that of the aforesaid fan unit; and an electronic circuit having a predetermined function and being forcedly air-cooled by all or a part of the plurality of fan units.

According to the electronic equipment as structured above, the electronic circuit can be forcedly air-cooled by the plurality of fan units cooperating with each other via the above wiring to perform distributed processing.

The above-described objects are also achieved by an electronic equipment which comprises: a single fan unit or a plurality of fan units having the same structure as that of the aforesaid fan unit; an electronic circuit having a predetermined function and being forcedly air-cooled by the single fan unit or all or a part of the plurality of fan units; a section for measuring all or a part of temperatures of the interior of a case in which the single or the plurality of fan unit(s) and the electronic circuit are disposed, the exterior of the case, and the surface or vicinity of an electronic device provided in this electronic circuit; and a section for performing processing for each of combinations of the measured temperatures, the combinations consisting of temperatures in number n equal to or less than the number of all of the temperatures measured by the above section; and a section for cooperating with broadcasting sections individually provided in these fan units via wiring, the wiring being laid between this section and a single fan unit or all or a part of the plurality of fan units and enabling a common interface with these broadcasting sections.

According to the electronic equipment as structured above, the revolving speeds of fans provided individually in the fan units is appropriately updated under distributed processing performed by the fan units and the additional broadcasting section which cooperate with each other via the wiring, even when referring to temperatures measured by a device other than these fan units is necessary for determining each revolving speed.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 10 is a view showing a structure example of a node to which forced air cooling is applied.

DESCRIPTION OF THE PREFERRED EMBODIMENTS

The principle of a fan unit according to the present invention is first explained.

Figure 1:
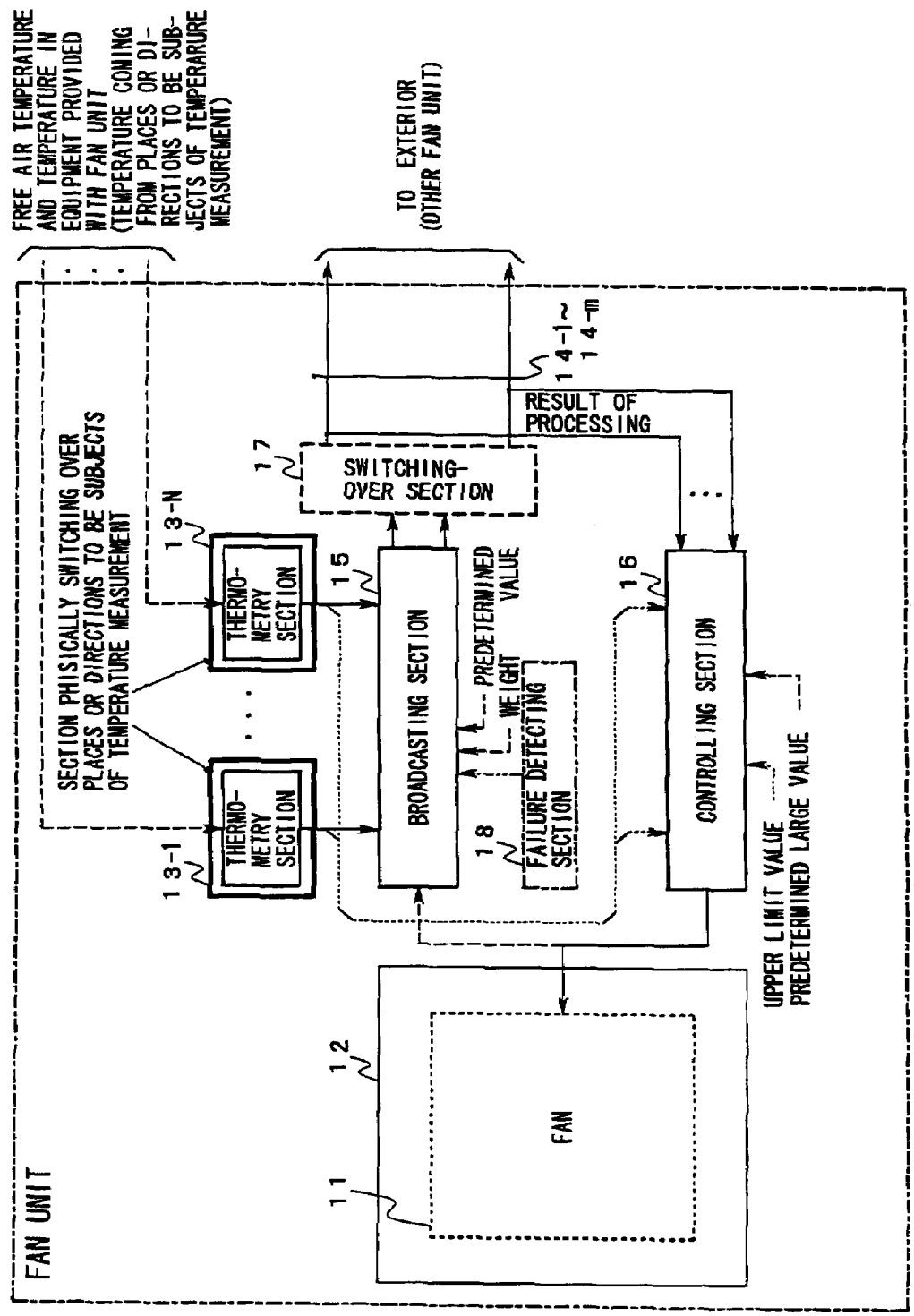
FIG. 1 is a block diagram showing the principle of a fan unit according to the present invention.

FIG. 1 is a block diagram showing the principle of the fan unit according to the present invention.

The fan unit shown in FIG. 1 is composed of a fan 11, a member 12, thermometry sections 13-1 to 13-N, lines 14-1 to 14-m, a broadcasting section 15, a controlling section 16, a switching-over section 17, and a failure detecting section 18.

The principle of a first fan unit according to the present invention is described as follows.

The thermometry sections 13-1 to 13-N measure temperature(s) of a single place or a plurality of places, and the broadcasting section 15 performs processing for each of combinations of the measured temperatures and notifies the processing result to an exterior via the lines 14-1 to 14-m. The combinations consist of temperatures in number n equal to or smaller than the number of all of the measured temperatures, and m is a number equal to or smaller than the number n. The controlling section 16 maintains the revolving speed of the attached fan 11 via the member 12 at a value determined in advance correspondingly to the processing result which is notified from the exterior via the lines 14-1 to 14-m.

In other words, in an equipment in which the fan unit according to the present invention is mounted, even when the plurality of fan units as described above are mounted, the broadcasting sections 15 and the controlling sections 16 provided individually in these fan units can realize the processing for computing the revolving speed of the fans 11 also individually provided in the fan units as distributed processing by cooperating with each other via the lines 14-1 to 14-m, m being a number smaller than the number n of the temperatures to be subjects of the processing.

Furthermore, this distributed processing is achieved without provision of an active circuit separately from the plurality of fan units, on the lines 14-1 to 14-m.

Therefore, the revolving speed of the fans 11 provided in individual fan units are maintained at a value suitable for the combinations of the temperatures measured by these fan units without causing structure complexity.

The principle of a second fan unit according to the present invention is described as follows.

The controlling section 16 sets the revolving speed of the fan 11 at a prescribed value when any of the temperatures measured by the thermometry sections 13-1 to 13-N is higher than a predetermined upper limit value.

In other words, the revolving speed of the fan 11 is set at the prescribed value when the temperature increases to the upper limit value which is high to maintain the revolving speed of the fan 11.

This prevents stress due to the increase in temperature given on a mechanism engaged in revolving the fan 11 as long as the aforesaid prescribed value is suitable for a characteristic of the mechanism with regard to the temperature.

The principle of a third fan unit according to the present invention is described as follows.

The broadcasting section 15 gives a notification to the exterior via any of the lines 14-1 to 14-m that the controlling section 16 sets the revolving speed of the fan 111 at a value equal to or smaller than the prescribed value, during a period when the revolving speed is set at the value.

In other words, it is possible to compensate, by other fan units connected thereto via the lines 14-1 to 14-m, for a shortfall in air quantity which occurs due to a decrease in the revolving speed of the fan 11 provided in the fan unit and which is to be used for predetermined forced air cooling.

Therefore, an air quantity necessary for this forced air cooling is secured flexibly based on load distribution.

The principle of a fourth fan unit according to the present invention is described as follows.

The switching-over section 17 is used for setting connection and disconnection between the broadcasting section 15 and the lines 14-1 to 14-m.

In other words, in an equipment provided with the fan unit according to the present invention, the revolving speed of the fan 11 for blowing air necessary for the forced air cooling can be determined based on any of the processing result obtained by the broadcasting section 15 provided in the fan unit and the processing result obtained by some other section.

This standardizes the structure and realizes flexible adaptability to various numbers and layouts of the fan units and electronic circuits mounted in the aforesaid equipment.

The principle of a fifth fan unit according to the present invention is described as follows.

The broadcasting section 15 and the controlling section 16 are both connected with the lines 14-1 to 14-m. The broadcasting section 15 includes a section used for setting permission and rejection of the operation of the broadcasting section 15.

In other words, in an equipment provided with the fan unit of the present invention, the revolving speed of the fan for blowing air necessary for the forced air cooling can be determined based on any of the processing result obtained by the broadcasting section 15 provided in the fan unit and the processing result obtained by some other section.

This standardizes the structure and realizes flexible adaptability to various numbers and layouts of the fan units and electronic circuits mounted in the aforesaid equipment.

The principle of a sixth fan unit according to the present invention is described as follows.

The broadcasting section 15 computes the sum of the temperatures belonging to each of the combinations and notifies the result to the exterior via a corresponding line out of the lines 14-1 to 14-m by sending a signal signifying that the computed sum is added to the sum of temperatures notified in parallel on the line by fan units other than the fan unit of the present invention.

In other words, in an equipment in which the plurality of fan units including the fan unit of the present invention is mounted, an air quantity used for the forced air cooling is appropriately set by the plurality of fan units which cooperate with each other via the lines 14-1 to 14-m, even when it is not univocally determined by a single temperature measured in any of the fan units.

Therefore, all the fan units mounted together with the fan unit of the present invention in the same equipment are capable of flexibly cooperating with each other based on load distribution and functional distribution.

The principle of a seventh fan unit according to the present invention is described as follows.

The broadcasting section 15 computes the sum of the temperatures in each of the combinations by weighting according to a weight determined in advance.

In other words, in an equipment in which the plurality of fan units including the fan unit of the present invention are mounted, an air quantity used for the forced air cooling is appropriately updated based on a desired rate of change relative to the individual temperatures measured by a part or all of these fan units.

Therefore, all the fan units mounted together with the fan unit of the present invention in the same common equipment are capable of cooperating with each other based on load distribution and functional distribution.

The principle of an eighth fan unit according to the present invention is described as follows.

The failure detecting section 18 detects a failure of the fan unit of the present invention, and the broadcasting section 15, upon the failure detection, appends a status indicating the failure detection to the processing result to be notified to the exterior via any of the lines 14-1 to 14-m.

In other words, the fan units mounted together with the fan unit of the present invention in the same equipment can recognize that the fan unit of the present invention has a failure.

Therefore, it is possible to compensate for an air quantity which a failed fan is to originally secure and which is to be used for a desired forced air cooling, by other normally operating fan units.

The principle of a ninth fan unit according to the present invention is described as follows.

The broadcasting section 15 appends information indicating that the fan unit of the present invention is mounted, to the processing result to be notified to the exterior via any of the lines 14-1 to 14-m.

Therefore, when the fan unit of the present invention is dismounted in the process of maintenance, operation, and other works, other fan units equipped together with this fan unit in the same equipment are able to recognize the state and compensate for shortfall in air quantity.

The principle of a tenth fan unit according to the present invention is described as follows.

The controlling section 16 sets the revolving speed of the fan 11 provided in the fan unit of the present invention at a predetermined large value when the processing result to be notified via any of the lines 14-1 to 14-m is not identifiable. The processing result signifies that some fan unit to be connected via the lines 14-1 to 14-m is mounted.

Therefore, it is possible to recognize the state that any of fan units equipped together with the fan unit of the present invention in the same equipment is dismounted, and to compensate for a shortfall in air quantity to be used for forced air cooling.

The principle of an eleventh fan unit according to the present invention is described as follows.

The thermometry sections 13-1 to 13-N respectively measure all the temperatures which are possible subjects of the measurement, out of a free air temperature and the temperature(s) of the single place or the plurality of places in an equipment provided with the fan unit of the present invention. The broadcasting section 15 selects a temperature to undergo some processing from the measured temperatures, and processes the temperature.

In other words, the thermometry sections 13-1 to 13-N are capable of measuring the temperatures flexibly adapting to various structures of equipments in which the fan unit of the present invention can be mounted.

Therefore, the structure is further standardized.

The principle of a twelfth fan unit according to the present invention is described as follows.

The thermometry sections 13-1 to 13-N maintain thermal coupling with individual places or directions which are possible subjects of temperature measurement and include a section used for physical switching-over of these places or directions.

In other words, the thermometry sections 13-1 to 13-N are capable of measuring the temperatures flexibly adapting to various structures of the equipments in which the fan unit of the present invention can be mounted.

Therefore, the structure is further standardized.

Figure 2:
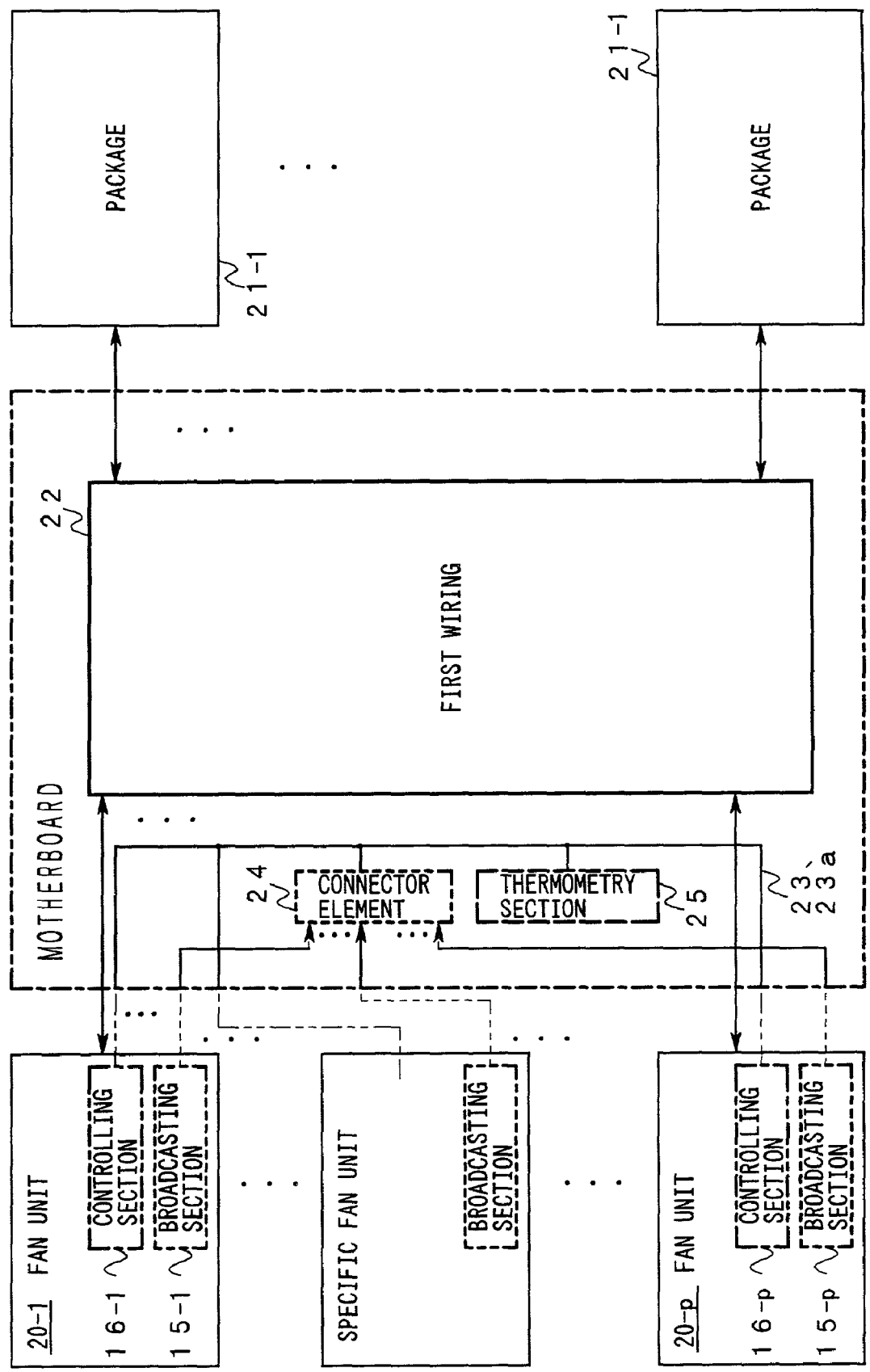
FIG. 2 is a block diagram showing the principle of a motherboard according to the present invention.

FIG. 2 is a block diagram showing the principle of a motherboard according to the present invention.

The motherboard shown in FIG. 2 is composed of fan units 20-1 to 20-p, packages 21-1 to 20-P, first wiring 22, second wiring 23 or 23a, a connector element 24, and a thermometry section 25.

The principle of a first motherboard according to the present invention is described as follows.

The first wiring 22 is formed as a wiring pattern and connected with either of the plurality of fan units 20-1 to 20-p of the present invention and the packages 21-1 to 21-P to be forcedly air-cooled by these fan units 20-1 to 20-p. The second wiring 23 is also formed as a wiring pattern together with the first wiring 22 and corresponds to bus-shaped lines 14-1 to 14-m in order to connect a broadcasting section provided in a specific fan unit out of the aforesaid plurality of fan units 20-1 to 20-p with the controlling sections individually provided in all of the rest of the fan units.

In other words, in an equipment provided with the plurality of fan units 20-1 to 20-p, the broadcasting sections 15 and the controlling sections 16 provided individually in these fan units 20-1 to 20-p are capable of cooperating with each other via the second wiring 23 which is formed in advance as the wiring pattern.

This realizes cost reduction and structure standardization as well as the forced air cooling of the packages 21-1 to 21-P connected with the aforesaid first wiring 22 with high reliability.

The principle of a second motherboard according to the present invention is described as follows.

The first wiring 22 is formed as a wiring pattern and connected with either of the plurality of fan units 20-1 to 20-p of the present invention and the packages 21-1 to 21-p which are to be forcedly air-cooled by these fan units 20-1 to 20-p. The second wiring 23a is formed as a wiring pattern together with the first wiring 22 and corresponds to the bus-shaped lines 14-1 to 14-m in order to connect a specific broadcasting section out of the broadcasting sections 15-1 to 15-p provided individually in the aforesaid plurality of fan units 20-1 to 20-p with all or a part of the controlling sections 16-1 to 16-p provided individually in these fan units 20-1 to 20-p. The connector element 24 is used for selecting the broadcasting section to be connected with the second wiring 23a from the broadcasting sections 15-1 to 15-p.

In other words, in an equipment provided with the plurality of fan units 20-1 to 20-p, the fan unit to distribute 'a processing result relating to determining the revolving speed of a fan' to other fan units via the lines 14-1 to 14-m can be selected from these fan units 20-1 to 20-p, flexibly adapting to the settings of the connector element 24.

Therefore, it is possible to realize the structure standardization and flexible adaptation to various numbers and layouts of the fan units and the packages to be mounted in the equipment.

The principle of a third motherboard according to the present invention is described as follows.

The second wiring 23 and 23a include wiring used for connection with the thermometry section 25 which is not provided in any of the plurality of fan units 20-1 to 20-p.

In other words, an equipment which is to be forcedly air-cooled by the fan units 20-1 to 20-p is structured without any additional wiring used for connection with the thermometry section 25, even when an air quantity necessary for the forced air cooling is determined based not only on temperatures measured by the thermometry sections 13-1 to 13-N individually provided in these fan units 20-1 to 20-p but also on temperatures measured by the aforesaid thermometry section 25.

Therefore the structure is further standardized.

Figure 3:
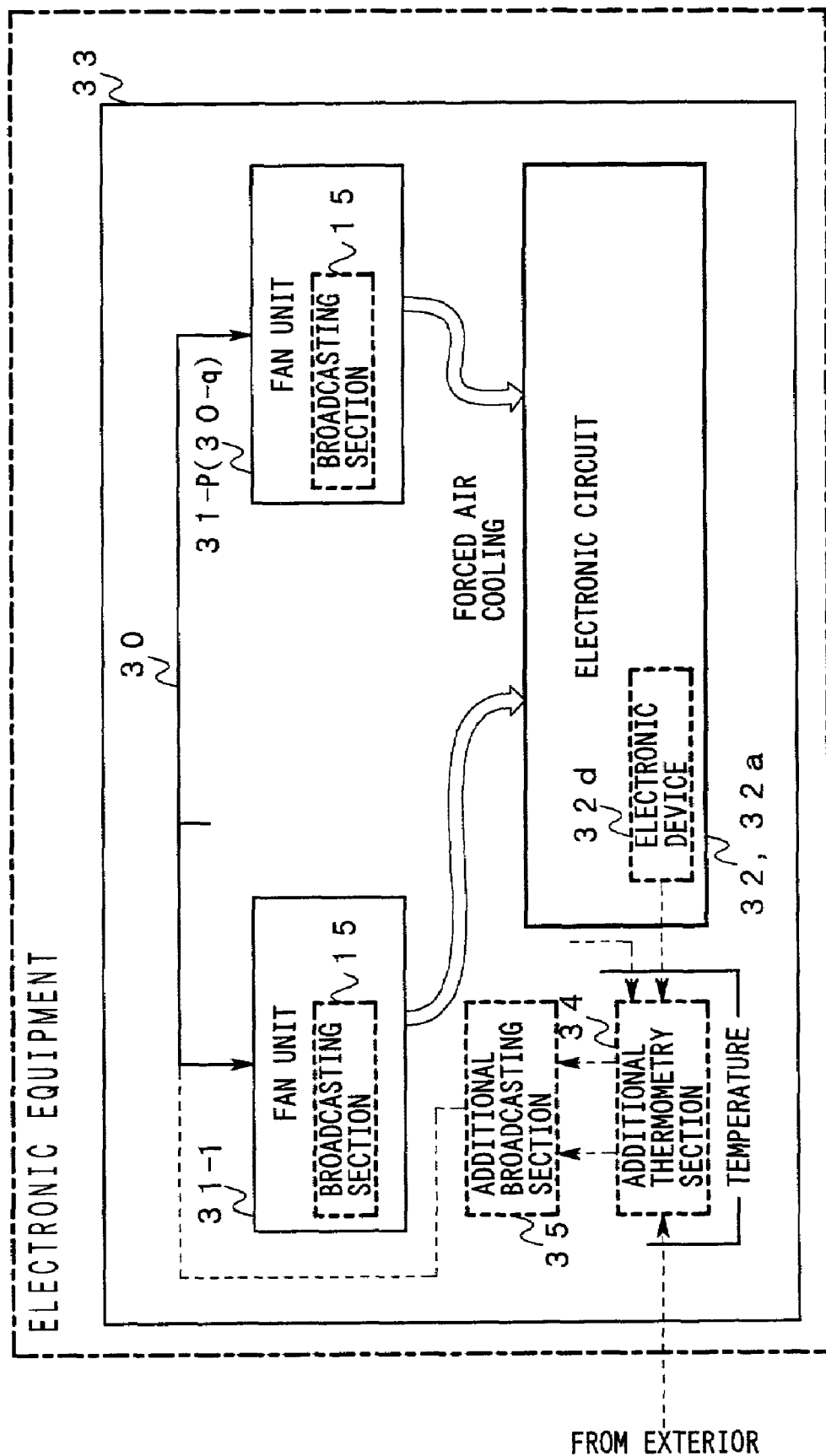
FIG. 3 is a block diagram showing the principle of an electronic equipment according the present invention.

FIG. 3 is a block diagram showing the principle of an electronic equipment according to the present invention.

The electronic equipment shown in FIG. 3 is composed of wiring 30, fan units 31-1 to 31-P (31-q), an electronic circuit 32 or 32a provided with an electronic device 32d, a case 33, an additional thermometry section 34, and an additional broadcasting section 35.

The principle of a first electronic equipment according to the present invention is described as follows.

The plurality of fan units 31-1 to 31-P to which the invention as described above is applied, cooperates with each other via the wiring 30 laid in a bus shape. The electronic circuit 32 has a predetermined function and is forcedly air cooled by all or a part of the fan units 31-1 to 31-P.

In other words, the forced air cooling of the electronic circuit 32 is achieved by the plurality of fan units 31-1 to 31-P cooperating with each other via the wiring 30 and performing distributed processing.

Therefore, it is able to prevent structure complexity because of provision of an active circuit, which is structured separately from the fan units 31-1 to 31-P, and also to realize cost reduction as well as structure standardization.

The principle of a second electronic equipment according to the present invention is described as follows.

An electronic circuit 32a has a predetermined function and is forcedly air cooled by a single fan unit or all or a part of a plurality of fan units 31-1 to 31-q of the present invention. The additional thermometry section 34 measures all or a part of temperatures of the interior of the case 33 in which these fan units 31-1 to 31-q and the electronic circuit 32a are disposed, the exterior of the case 33, the surface or vicinity of the electronic device 32d provided in this electronic circuit 32a. The additional broadcasting section 35 performs processing for each of combinations of the measured temperatures, the combinations consisting of temperatures in number n equal to or smaller than the number of all of the measured temperatures; and cooperates with the broadcasting sections 15 individually provided in these fan units 31-1 to 31-q via the wiring 30.

In other words, the revolving speed of fans provided individually in the fan units 31-1 to 31-q is appropriately updated under distributed processing performed by the fan units 31-1 to 31-q and the additional broadcasting section 35 which cooperate with each other via the aforesaid wiring 30, even when referring to temperatures measured by a device other than these fan units 31-1 to 31-q is required for determining the individual revolving speed.

This prevents structure complexity due to provision of an active circuit structured separately from the fan units 31-1 to 31-P, and realizes cost reduction as well as structure standardization.

Embodiments of the present invention are explained in detail below with reference to the drawings.

Figure 4:
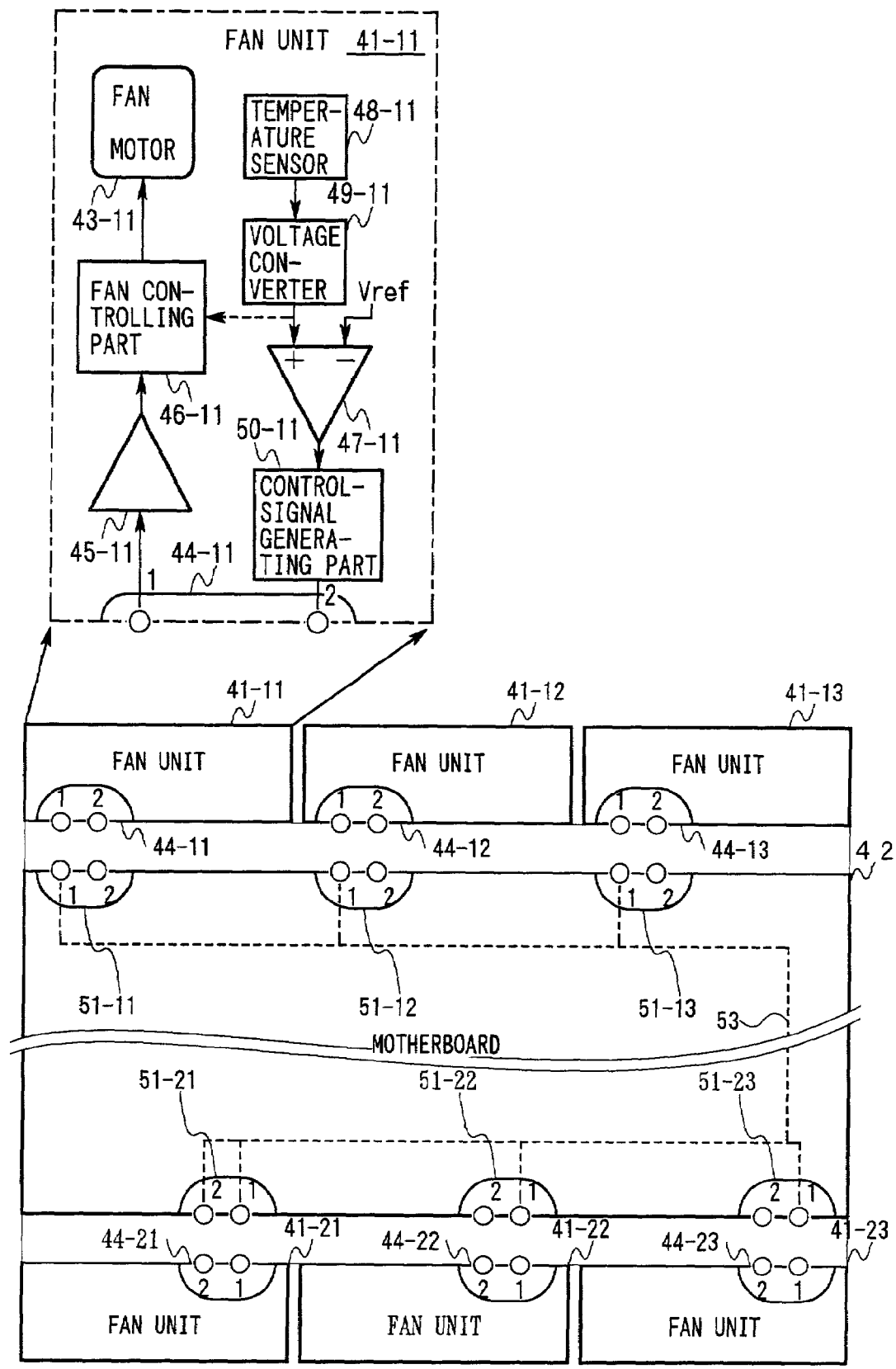
FIG. 4 is a block diagram showing a first embodiment and a sixth embodiment of the present invention.

FIG. 4 is a block diagram showing a first embodiment and a sixth embodiment of the present invention.

In FIG. 4, fan units 41-11 to 41-13 and 41-21 to 41-23 are disposed in the upper part of a shelf 102-1 and the lower part of a shelf 102-2. On the rear faces of these shelves 102-1 and 102-2, connectors (not shown) used for attaching and detaching packages 103-101 to 103-113 and 103-21 to 103-29 shown in FIG. 10 are fixed and a motherboard 42 in which main wiring laid among these connectors are formed in advance as a wiring pattern is provided.

Incidentally, the present invention does not relate to the above wiring, and therefore, it is not shown or explained.

The fan unit 41-11 is provided with the following elements together with a fan motor 43-11 and a plug 44-11.

a line receiver 45-11 and a fan controlling part 46-11 cascaded between a first pin of the plug 44-11 and a driving input of the fan motor 43-11 a comparator 47-11 to whose inverting input a predetermined reference voltage Vref is applied and which has a hysteresis characteristic a temperature sensor 48-11 a voltage converter 49-11 connected with an output of the temperature sensor 48-11 and a non-inverting input of the comparator 47-11 a control-signal generating part 50-11 cascaded with the comparator 47-11, with an output thereof connected with a second pin of the plug 44-11

Incidentally, the structure of the fan units 41-12, 41-13, and 41-21 to 41-23 is the same as that of the fan unit 41-11, and therefore, the same numerals with subscripts '12', '13', and '21' to '23' being added respectively are hereinafter used to designate corresponding components, and the explanation thereof is omitted here.

The motherboard 42 is provided with receptacles 51-11 to 51-13 and 51-21 to 51-23 which make pairs with the aforesaid plugs 44-11 to 44-13 and 44-21 to 44-23 respectively and which enable the fan units 41-11 to 41-13 and 41-21 to 41-23 to be attached and detached, and a wiring pattern (hereinafter, referred to as a 'fan controlling pattern') 53 which connects first pins of all the receptacles 51-11 to 51-13 and 51-21 to 51-23 and a second pin of only the receptacle 51-21 is formed.

The operation of this embodiment is explained below.

First, to explain what is common to the fan units 41-11 to 41-13 and 41-21 to 41-23, a subscript 'C' is hereinafter used as a first subscript which signifies that what is explained is applicable to both '1' and '2', and a subscript 'c' is used as a second subscript which signifies that what is explained is applicable to all of '1' to '3'.

In the fan unit 41-21, a temperature sensor 48-21 measures a temperature T, which is either a temperature of a specific place of a node or a temperature of an exterior thermally coupled with the node (supposed to be a 'free air temperature' here for simplification).

A voltage converter 49-21 converts thus measured temperature T to a voltage V and a comparator 47-21 compares the voltage V with the aforesaid reference voltage Vref.

A control-signal generating part 50-21 has an output impedance which is much smaller than an input impedance of a line receiver 45-Cc individually provided in the fan unit 41-Cc.

Furthermore, the control-signal generating part 50-21 distributes a signal indicating the result of the above comparison (hereinafter, referred to as a 'fan control signal') as an instantaneous value of a binary voltage to the fan unit 41-Cc via the second pins of the plug 44-21 and the receptacle 51-21, the fan controlling pattern 53, and first pins of the plug 44-Cc and the receptacle 51-Cc.

Figure 5:
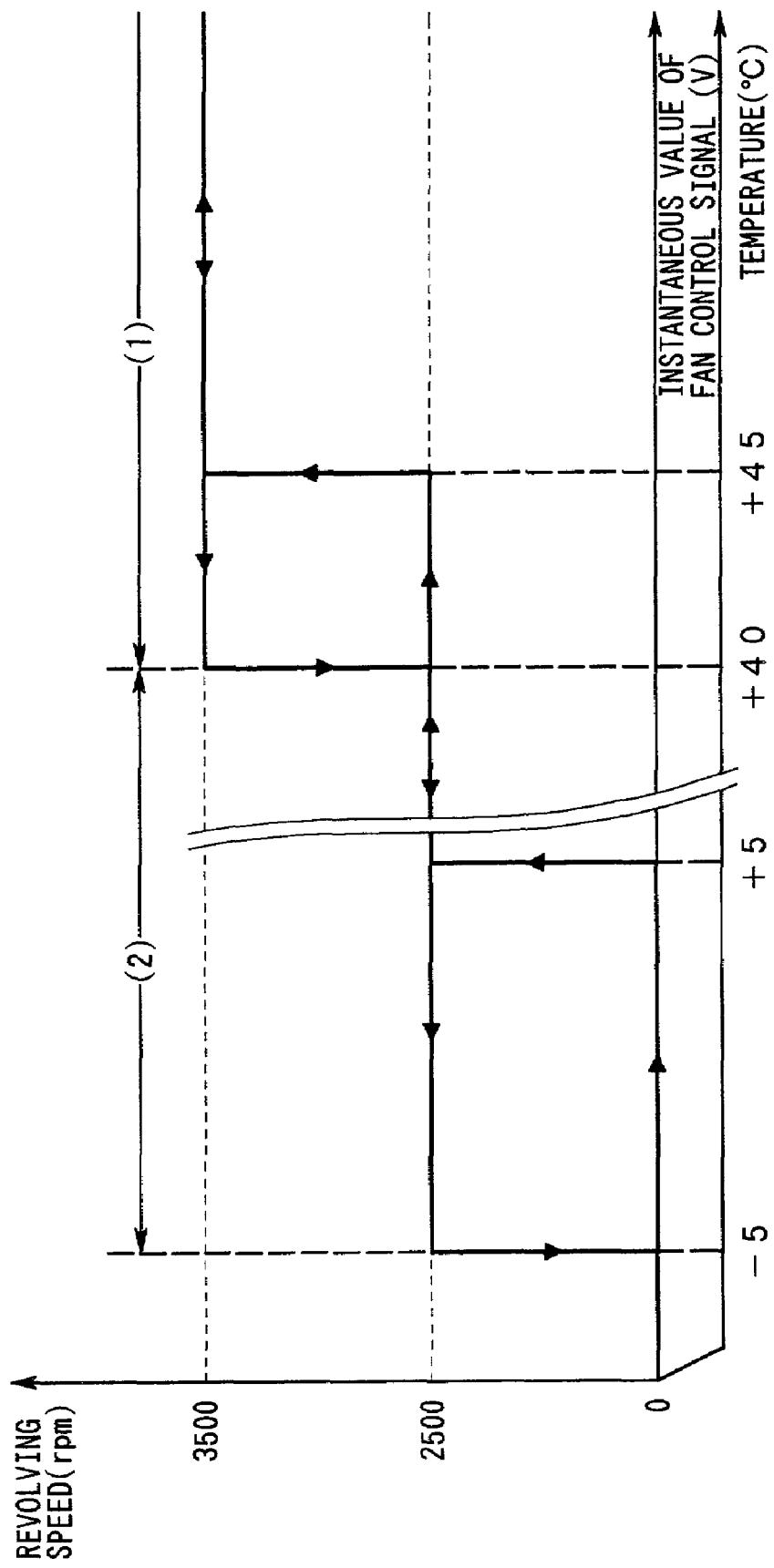
FIG. 5 is a chart showing the revolving speed of a fan which is set according to temperature.

In the fan unit 41-Cc, a fan controlling part 46-Cc sets the revolving speed of a fan for the instantaneous value of the fan control signal given thereto via the line receiver 45-Cc, for example, based on the hysteresis characteristic shown in FIG. 5.

Therefore, when the aforesaid reference voltage Vref corresponds to the free air temperature of, for example, 45° C. which is measured by the temperature sensor 48-21 and the range of hysteresis of the comparator 47-21 which is converted to temperature is 5° C., the revolving speed of the fan provided individually in the fan unit 41-Cc is set at 3500 rpm from the instant when the free air temperature increases to 45° C. or higher to the instant when it decreases to less than 40° C. (FIG. 5(1)), while it is maintained at 2500 rpm during a period when the free air temperature is lower than 40° C. (FIG. 5(2)).

In other words, the fan unit 41-21 in which the temperature sensor 48-21 for measuring the temperature is mounted plays a leading role in determining the revolving speed to be set for the fan provided in the fan unit 41-Cc according to the temperature and in presenting the above hysteresis characteristic based on which the revolving speed is switched over.

Therefore, according to this embodiment, as long as the temperature measured by the temperature sensor 48-21 is a temperature of a desired place, the revolving speed of the fan provided in the fan unit 41-Cc is easily maintained at a value suitable for this temperature via the fan controlling pattern 53 provided instead of a control unit, which is structured separately from the fan unit 41-Cc, and formed as a wiring pattern in the motherboard 42.

Incidentally, the temperature sensor 48-21 measures only the free air temperature in this embodiment.

However, the present invention is not limited to this structure and, for example, when the temperature sensor 48-21 measures temperatures of some places together with the free air temperature in parallel, the instantaneous value of the fan control signal may be computed by the voltage converter 49-21, the comparator 47-21, and the control-signal generating part 50-21, or hardware and/or software which can substitute for these, based on any of the following arithmetic operations, as long as the instantaneous value is determined univocally according to combinations of these temperatures.

linear combination of the individual temperatures based on prescribed weighting ('1' is acceptable)

an arithmetic operation appropriate for a degree of thermal coupling between the places whose temperatures are measured and a specific circuit or device (including an arithmetic operation based on an experimental formula)

the above-mentioned linear combination or arithmetic operation performed for the combinations of 'a part of the temperatures', out of the measured plural temperatures, which are determined univocally based on any of an instruction given from the exterior, office data, and values or combinations of these temperatures Moreover, in this embodiment, the temperature sensor 48-21 measures only the free air temperature by being provided in a specific place inside the fan unit 41-21.

However, the present invention is not limited to this structure, and a desired place whose temperature is to be measured by the temperature sensor 48-21 may be determined freely, for example, by providing the following mechanism or plug.

a mechanism for blocking thermal coupling between the temperature sensor 48-21 and places except the desired place a plug being mounted in advance in places near all places which are possible desired places and enabling their connection with a terminal (pin) of the temperature sensor 48-21 to be switched over freely Furthermore, in this embodiment, the receptacles 51-11 to 51-13 and 51-21 to 51-23 are mounted in the motherboard 42 and the fan controlling pattern 53 is formed as a wiring pattern in the motherboard 42.

However, the present invention is not limited to this structure, and, for example, the receptacles 51-11 to 51-13 and 51-21 to 51-23 may be directly attached to the upper part of the shelf 102-1 and the lower part of the shelf 102-2 respectively and the fan controlling pattern 53 may be structured as appropriately bundled wiring on a rear face or a side face of these shelves 102-1 and 102-2.

Figure 6:
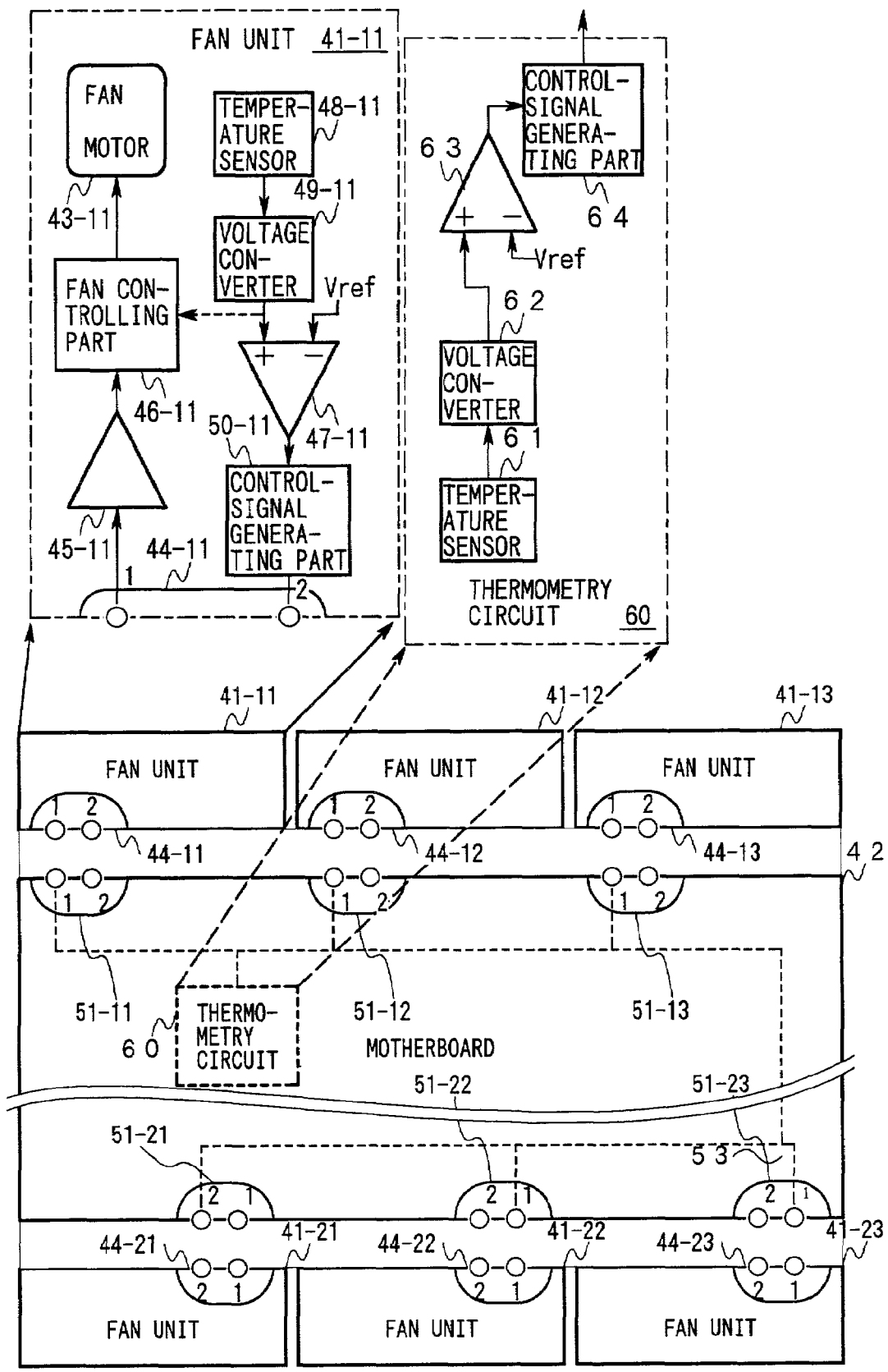
FIG. 6 is a block diagram showing a second embodiment of the present invention.

FIG. 6 is a block diagram showing a second embodiment of the present invention.

In FIG. 6, this embodiment is characterized by the following.

A thermometry circuit 60 is disposed in a region near a place whose temperature on a specific package (supposed to be a package denoted by the numeral '103-101' in FIG. 10 here for simplification), out of regions of the motherboard 42, is to be detected.

An output of the thermometry circuit 60 instead of the first pin of the receptacle 51-21 is connected with the fan controlling pattern 53.

Incidentally, the structure of the thermometry circuit 60 is the same except that the line receiver 45-11, the fan controlling part 46-11, the fan motor 43-11, and the plug 44-11 are removed from the fan unit 41-11, and therefore, numerals '61', '62', '63', and '64' are hereinafter used to designate a temperature sensor, a voltage converter, a comparator, and a control-signal generating part respectively for simplification and the explanations thereof are omitted here.

The operation of this embodiment is explained below.

Since the operations performed by the parts of the thermometry circuit 60 in the process in which the thermometry circuit 60 sends out the fan control signal to the fan controlling pattern 53 is basically the same as the operations performed by the temperature sensor 48-21, the voltage converter 49-21, the comparator 47-21, and the control-signal generating part 50-21 respectively which are provided in the fan unit 41-21 in the above-described first embodiment, the explanation thereof is omitted here.

In this embodiment, a temperature sensor 61 provided in the thermometry circuit 60 measures the temperature of the predetermined place of the aforesaid specific package 103-101 in the region near the predetermined place.

In other words, even when a place whose temperature is to be referred to in generating the fan control signal is physically distant from places where the fan units 41-11 to 41-13 and 41-21 to 41-23 are mounted, the revolving speed of the fans provided in these fan units 41-11 to 41-13 and 41-21 to 41-23 is flexibly set at a value suitable for the temperature.

Therefore, according to this embodiment, restrictions on component layout of the packages 103-101 to 103-113 and 103-21 to 103-29 and layout of these packages 103-101 to 103-113 and 103-21 to 103-29 in the shelves 102-1 and 102-2 are greatly eased and the revolving speed of the fans is flexibly maintained at a value suitable for the temperature of the desired place.

Incidentally, the fan control signal is sent out to the fan controlling pattern 53 only by the thermometry circuit 60 in this embodiment.

However, the present invention is not limited to this structure and, for example, when a fan control signal sent out in parallel from any of the fan units 41-11 to 41-13 and 41-21 to 41-23 is properly added (synthesized) on the fan controlling pattern and the revolving speed of the fans is set at an appropriate value according to this result, the fan control signals both from any of the fan units 41-11 to 41-13 and 41-21 to 41-23 and from the thermometry circuit 60 may be sent out in parallel to the fan controlling pattern 53.

Furthermore, the thermometry circuit 60 measures the temperature of a single place in this embodiment.

However, the number of places whose temperatures are to be measured by the above thermometry circuit 60 may be plural similar to that of the places whose temperatures are to be measured by the fan unit 41-21 in the first embodiment.

Moreover, in this embodiment, the control-signal generating part 64 disposed on the final stage of the thermometry circuit 60 constantly operates and no setting is made in the thermometry circuit 60 or the motherboard 42 on whether or not the fan control signal generated by the control-signal generating part 64 is to be sent out to the fan controlling pattern 53.

However, the present invention is not limited to this structure, and, for example, setting for connection and disconnection between an output of the control-signal generating part 64 and the fan controlling pattern 53 or setting for permission and rejection of the operation of the control-signal generating part 64 may be performed via a switch, a short pin, a logical circuit, or others to realize structure standardization and flexibility.

Figure 7:
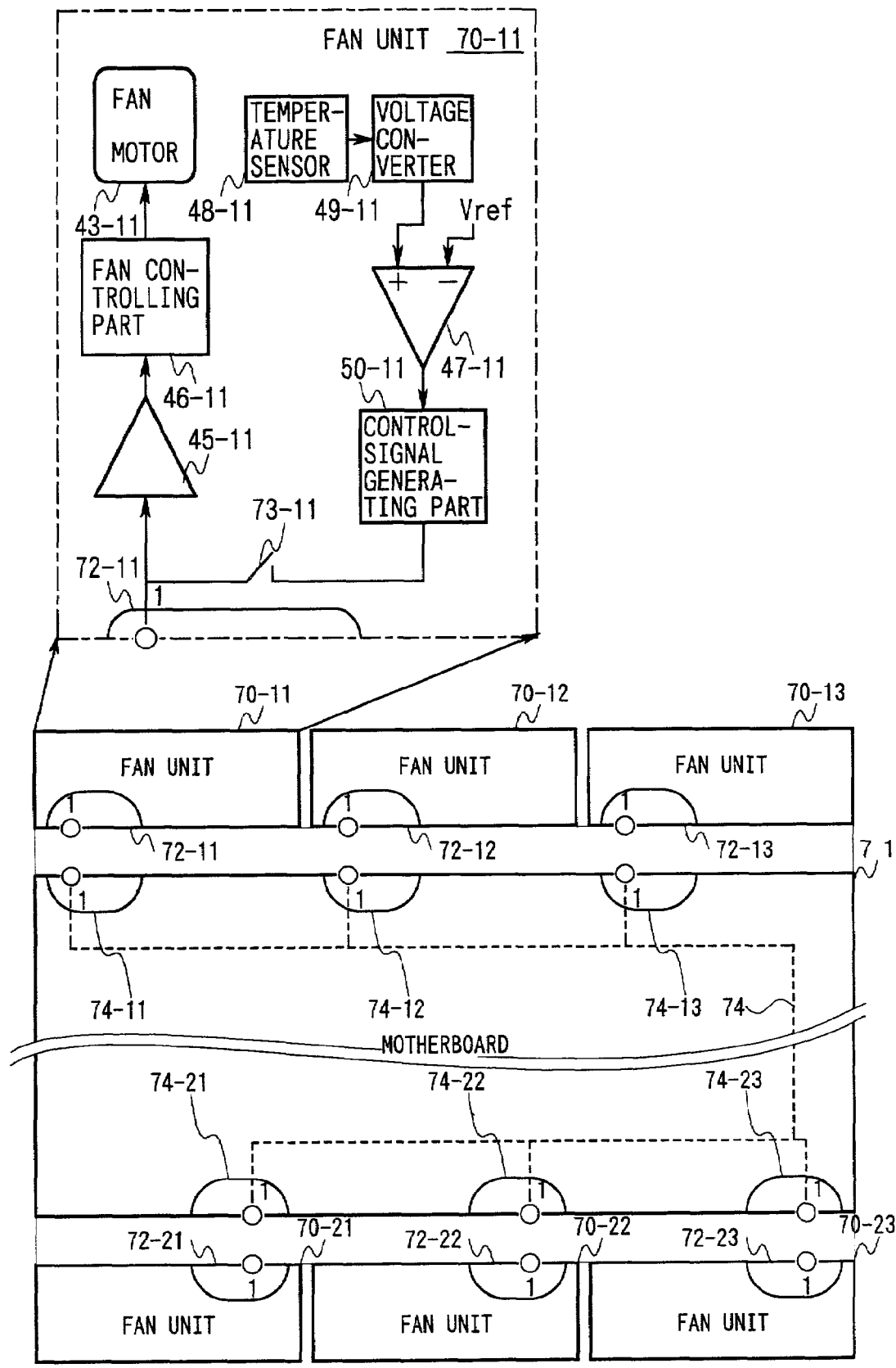
FIG. 7 is a block diagram showing a third embodiment of the present invention.

FIG. 7 is a block diagram showing a third embodiment of the present invention.

In FIG. 7, this embodiment is characterized by the structure of fan units 70-11 to 70-13 and 70-21 to 70-23 provided instead of the fan units 41-11 to 41-13 and 41-21 to 41-23 and the structure of a motherboard 71 provided instead of the motherboard 42.

In the fan unit 70-11, a plug 72-11 having 'one' pin is provided instead of the plug 44-11, and a switch 73-11 having a first contact and a second contact which are connected with the pin of the plug 72-11 and the output of the control-signal generating part 50-11 respectively is provided.

Incidentally, the structure of the fan units 70-12, 70-13, and 70-21 to 72-23 is the same as that of the fan unit 70-11, and therefore, the same numerals are hereinafter used to designate corresponding components with subscripts '12', '13', and '21' to '23' being added respectively and they are not explained or shown in the drawing here.

Moreover, in the motherboard 71, receptacles 74-11 to 74-13 and 74-21 to 74-23 each of which has 'one' pin and which make pairs with the above-mentioned plugs 72-11 to 72-13 and 72-21 to 72-23 are provided instead of the receptacles 51-11 to 51-13 and 51-21 to 51-23, and a fan controlling pattern 75 substituting for the aforesaid fan controlling pattern 53 is formed as a wiring pattern connected with all pins of these receptacles 74-11 to 74-13 and 74-21 to 74-23.

The operation of this embodiment is explained below.

The pin of the plug 72-11 provided in the fan unit 70-21 is connected with the control-signal generating part 50-11 via a switch 73-21, and the pins of the plugs 72-11 to 72-13 and 72-22 to 72-23 provided in the fan units 70-11 to 70-13 and 70-22 to 70-23 respectively are steadily connected with inputs of the line receivers 45-11 to 45-13 and 45-22 to 45-23 via switches 73-11 to 73-13 and 73-22 to 73-23 respectively.

In other words, fan control signals are exchanged, similarly to the first embodiment, among the fan units 70-11 to 70-13 and 70-21 to 70-23 via the plugs 72-11 to 72-13 and 72-21 to 72-23 and the receptacles 74-11 to 74-13 and 74-21 to 74-23 each of which has 'one' pin and via the aforesaid fan controlling pattern 75.

Therefore, the physical size of components mounted in the motherboard 71 can be reduced, which enhances flexibility in the selection of the layout and the width of a wiring pattern of the fan controlling pattern 75.

Incidentally, in this embodiment, any of outputs of the control-signal generating parts 50-11 to 50-13 and 50-21 to 50-23 is connected with the plugs 72-11 to 72-13 and 72-21 to 72-23 via the switches 73-11 to 73-13 and 73-21 to 73-23.

Figure 8:
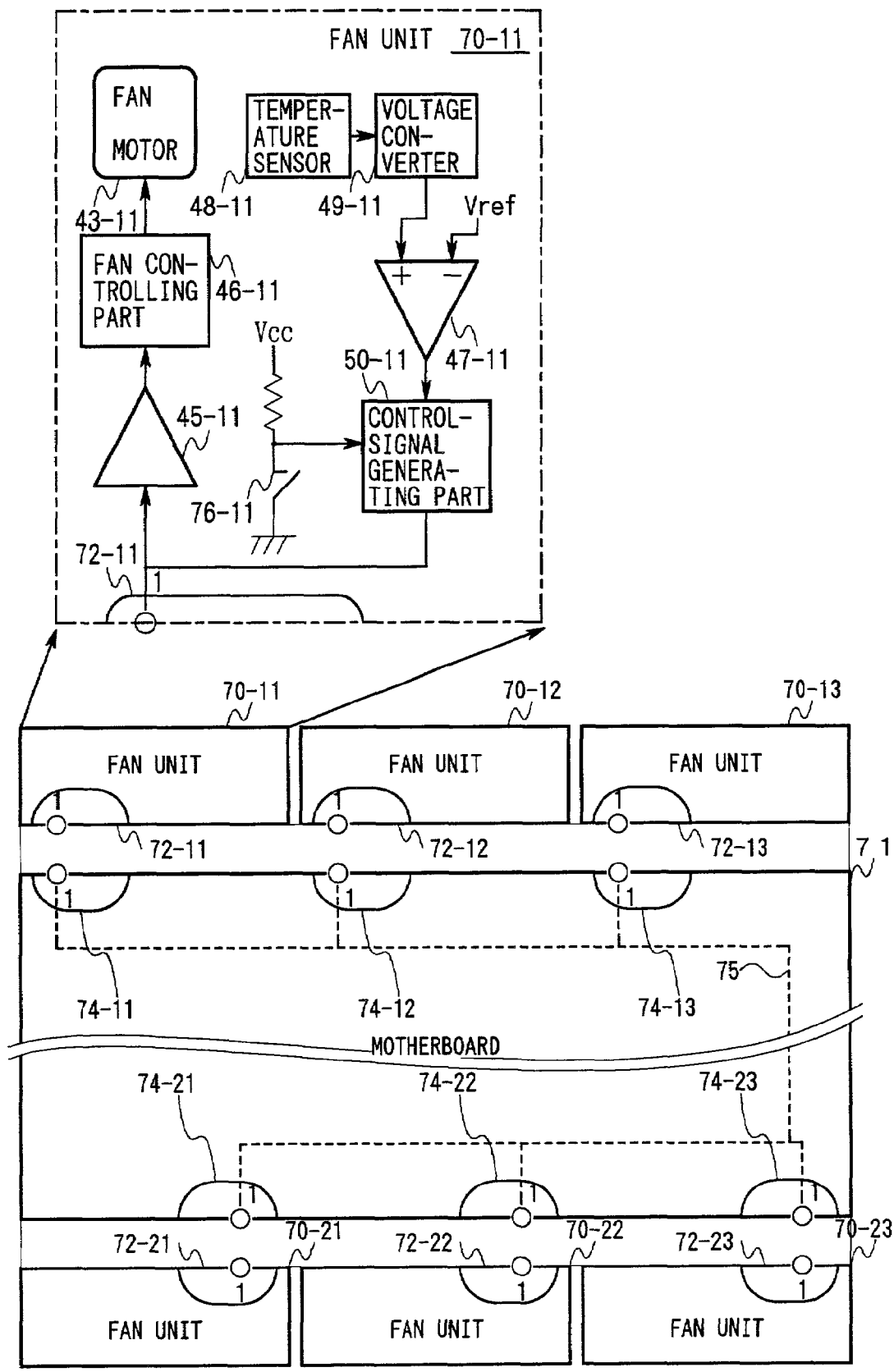
FIG. 8 is a block diagram showing another structure of the third embodiment of the present invention.

However, the present invention is not limited to this structure, and for example, the operation of the control-signal generating parts 50-11 to 50-13 and 50-21 to 50-23 may be permitted or restricted according to the contact state of switches 76-11 to 76-13 and 76-21 to 76-23 as shown in FIG. 8.

Furthermore, in this embodiment, the aforesaid switches 73-11 to 73-13 and 73-21 to 73-23 (76-11 to 76-13 and 76-21 to 76-23) may be disposed on the motherboard 42 when it is permissible that the receptacles 74-11 to 74-13 and 74-21 to 74-23 and the plugs 72-11 to 72-13 and 72-21 to 72-23 have 'two' pins.

Moreover, these switches 73-11 to 73-13 and 73-21 to 73-23 (76-11 to 76-13 and 76-21 to 76-23) are not limited to switches having mechanical contacts and, for example, may be formed in advance as a wiring pattern, and may be formed as wiring added among lands or structured as a digital circuit such as a short pin, a gate circuit, or the like.

Furthermore, in this embodiment, the fan control signals which are analog signals are exchanged among the fan units 70-11 to 70-13 and 70-21 to 70-23 via the fan controlling pattern 53.

However, the present invention is not limited to this structure, and the fan control signals may be generated as digital signals, for example, having two states, namely, a state in which station power supply is supplied and a state in which it is not supplied, and may be exchanged via an inner layer in which a wiring pattern corresponding to a power supply line is to be formed, out of layers owned by the motherboard 71, so that the wiring for the fan control signal can be substantially free from restrictions, and an SN ratio is improved.

Figure 9:
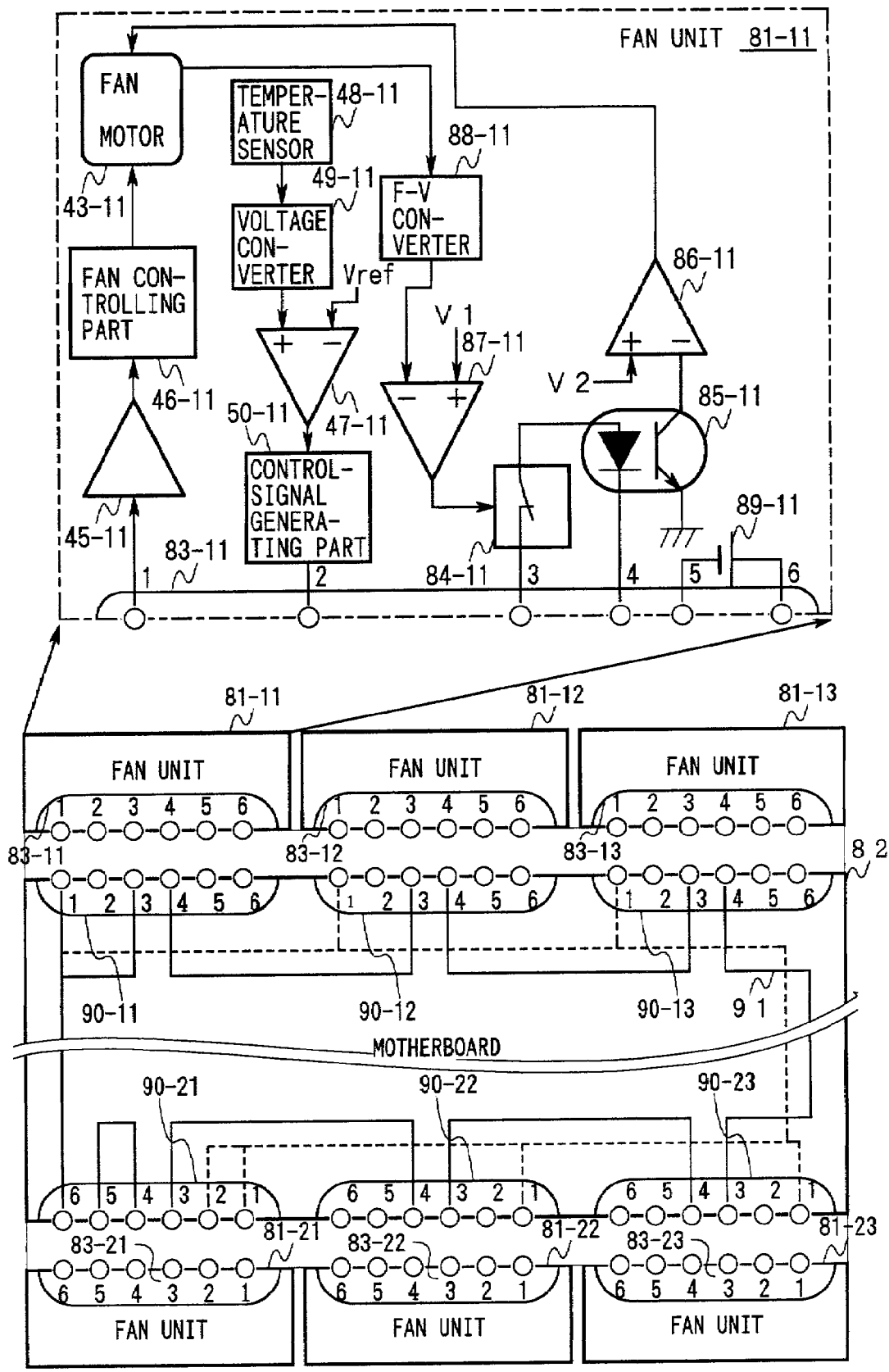
FIG. 9 is a block diagram showing a fourth embodiment and a fifth embodiment of the present invention.

FIG. 9 is a block diagram showing a fourth embodiment and a fifth embodiment of the present invention.

These embodiments are characterized in that fan units 81-11 to 81-13 and 81-21 to 81-23 are provided instead of the aforesaid fan units 41-11 to 41-13 and 41-21 to 41-23 and a motherboard 82 is provided instead of the motherboard 42.

The fan units 81-11 to 81-13 and 81-21 to 81-23 (hereinafter, what is common to these fan units 81-11 to 81-13 and 81-21 to 81-23 is described using a subscript 'Cc' which is applicable to any one of '11' to '13' and '21' to '23') are provided with the following elements.

- a plug 83-Cc provided instead of the plug 72-Cc and having 'six' pins
- a switch 84-Cc with one contact thereof connected with a third pin of the plug 83-Cc
- a photo coupler 85-Cc having a photodiode in the primary side thereof with a positive pole and a negative pole thereof connected with the other contact of the switch 84-Cc and a fourth pin of the plug 83-Cc respectively
- a comparator 86-Cc which is provided in the secondary side of this photo coupler 85-Cc, whose inverting input is connected with a collector of a transistor whose emitter is grounded, to whose non-inverting input a reference voltage V2 is applied, and whose output is connected with a corresponding control input of a fan motor 43-Cc.
- a comparator 87-Cc to whose non-inverting input a reference voltage V1 is applied and whose output is connected with a control terminal of the switch 84-Cc
- an F-V converter 88-Cc with an input thereof connected with a supervisory output of the fan motor 43-Cc and with an output thereof connected with an inverting input of the comparator 87-Cc
- a DC power supply 89-Cc with a negative pole and a positive pole thereof connected with a fifth pin and a sixth pin of the plug 83-Cc respectively In the motherboard 82, receptacles 90-11 to 90-13 and 90-21 to 90-23 which make pair with the aforesaid plugs 83-11 to 83-13 and 83-21 to 83-23 are fixed and the following supervisory/control patterns 91 connected with third pins and fourth pins of these receptacles 90-11 to 90-13 and 90-21 to 90-23 are formed as a wiring pattern.

- from the third pin of the receptacle 90-11 to a sixth pin of the receptacle 90-21
- from the third pin of the receptacle 90-21 to the fourth pin of the receptacle 90-22
- from the third pin of the receptacle 90-22 to the fourth pin of the receptacle 90-23
- from the third pin of the receptacle 90-23 to the fourth pin of the receptacle 90-13
- from the third pin of the receptacle 90-13 to the fourth pin of the receptacle 90-12
- from the third pin of the receptacle 90-12 to the fourth pin of the receptacle 90-11
- from the fourth pin of the receptacle 90-21 to the fifth pin of the receptacle 90-21

The operation of the fourth embodiment of the present invention is explained below with reference to FIG. 9.

The F-V converter 88-Cc converts the revolving speed of the fan motor 43-Cc to a voltage (supposed here to become a smaller value as the revolving speed of the fan motor 43-Cc is higher for simplification) and the comparator 87-Cc sets the contact of the switch 84-Cc kept closed during a period when this voltage is higher than the aforesaid threshold value V1 (signifying that the revolving speed of the fan motor 43-Cc is not decreased).

During the period when all the switches 84-11 to 84-13 and 84-21 to 84-23 are thus kept closed, the photo transistors individually provided in the second winding of the photo couplers 85-11 to 85-13 and 85-21 to 85-23 are supplied with DC power from a DC power supply 89-21 via an annular DC circuit which is formed via the plugs 83-11 to 83-13 and 83-21 to 83-23, the receptacles 90-11 to 90-13 and 90-21 to 90-23, the supervisory/control pattern 91, and the photo diodes individually provided in the primary side of the photo couplers 85-11 to 85-13 and 85-21 to 85-23 as well as via these switches 84-11 to 84-13 and 84-21 to 84-23, so that the photo transistors are maintained in a saturation region.

In this state, the comparators 86-11 to 86-13 and 86-21 to 86-23 set the revolving speed of the fan motors 43-11 to 43-13 and 43-21 to 43-23 at a normal value since an electric potential of the aforesaid non-inverting inputs of the comparators 86-11 to 86-13 and 86-21 to 86-23 is set at a smaller value than the reference voltage V2.

However, when the revolving speed of the fan motor 43-11 provided in any of the fan units 81-11 to 81-13 and 81-21 to 81-23 (supposed to be the fan unit 81-11 here for simplification) decreases for some reason and the voltage obtained at the output of the F-V converter 88-11 becomes lower than the reference voltage V1 according to this revolving speed, the comparator 87-11 sets the contact of the switch 84-11 open in accordance with comparison in largeness between these values of the voltages.

In the fan units 81-11 to 81-13 and 81-21 to 81-23, the aforesaid annular DC circuit is opened by the switch 84-11 so that the DC power is not supplied to any of the photo couplers 85-11 to 85-13 and 85-21 to 85-23.

Since the electric potential of each of the inverting inputs becomes a larger value than the reference voltage V2, the comparators 86-11 to 86-13 and 86-21 to 86-23 set the revolving speed of the fan motors 43-11 to 43-13 and 43-21 to 43-23 at a value larger than the aforesaid normal value.

In other words, when the revolving speed of any of the fan motors 43-11 to 43-13 and 43-21 to 43-23 becomes lower than a prescribed value, the revolving speed of these fan motors 43-11 to 43-13 and 43-21 to 43-23 is automatically updated to a value large enough to compensate for an air quantity of the fan motor whose revolving speed has decreased.

Therefore, according to this embodiment, load distribution by the fan motors 43-11 to 43-13 and 43-21 to 43-23 is maintained, and the decreased air quantity is automatically compensated by the other fan motors, even without any control unit being provided in the exterior.

The operation of the fifth embodiment of the present invention is explained below with reference to FIG. 9.

The aforesaid annular DC circuit is also opened when any of the fan units 81-11 to 81-13 and 81-21 to 81-23 is dismounted.

In the individual fan units which remain mounted in this state, the revolving speed of the fan motors is set at a value larger than the normal value, similarly to the case when the revolving speed of the fan motor mounted in a specific fan unit decreases in the fourth embodiment described above.

Therefore, according to this embodiment, load distribution by the fan motors 43-11 to 43-13 and 43-21 to 43-23 is maintained, and an air quantity of the dismounted fan motor is automatically compensated by the other fan motors even without any control unit being provided in the exterior.

A sixth embodiment of the present invention is explained below with reference to FIG. 4.

This embodiment is characterized in that fan controlling parts 54-11 to 54-13 and 54-21 to 54-23 are provided instead of the fan controlling part 46-11 to 46-13 and 46-21 to 46-23 and outputs of voltage converters 49-11 to 49-13 and 49-21 to 49-23 are connected with control terminals of these fan controlling parts 54-11 to 54-13 and 54-21 to 54-23 respectively as shown by the dotted arrow in FIG. 4.

The operation of the sixth embodiment of the present invention is explained below with reference to FIG. 4.

In the fan unit 41-Cc, the lower a value for the DC voltage outputted by the voltage converter 49-Cc becomes, the lower the temperature measured by the temperature sensor 48-Cc becomes.

The fan controlling part 54-Cc regularly judges whether or not the DC voltage outputted by the voltage converter 49-Cc is lower than a prescribed lower limit value and when the result of the judgment is false, it sets the revolving speed of the fan motor 43-Cc at a value suitable for the instantaneous value of the fan control signal which is given thereto via the line receiver 45-Cc, similarly to the first embodiment described above.

Meanwhile, when the result of the above judgment is true, the fan controlling part 54-Cc sets the revolving speed of the fan motor 43-Cc at a prescribed low value regardless of an instantaneous value of the fan control signal given thereto via the line receiver 45-Cc or restricts the revolving of the fan motor 43-Cc.

In other words, when the temperature measured by the temperature sensor 43-Cc decreases equal to or lower than a predetermined low temperature (for example, the temperature at which lubricant can function effectively in a revolving mechanism provided in the fan motor 43-Cc), the fan motor 43-Cc is automatically restricted in its revolving or prevented from revolving at a normal revolving speed.

Therefore, according to this embodiment, the revolving speed of the fan motor 43-Cc is flexibly adaptable to the structure of the revolving mechanism provided in the fan motor 43-Cc and is maintained at a proper value over a wide temperature range.

Incidentally, in this embodiment, the present invention is applied to the first embodiment previously described.

However, the present invention is not limited to the first embodiment described above, and is also applicable to any of the second embodiment to the fifth embodiment described above.

In the embodiments described above, the analog DC signals are exchanged among the fan units 41-11 to 41-13 and 41-21 to 41-23, among the fan units 70-11 to 70-13 and 70-21 to 23, and among the fan units 81-11 to 81-13 and 81-21 to 81-23 via the fan controlling pattern 53 and the supervisory/control pattern 91.

However, in the present invention, for example, signals substituting for these analog DC signals may be exchanged in an analog region or a digital region via channels which are allotted individually to the fan units 41-11 to 41-13 and 41-21 to 41-23, and the fan units 81-11 to 81-13 and 81-21 to 81-23 and which are formed based on a predetermined multiple access system.

Furthermore, these signals need not be electric signals and may be, for example, optical signals.

Moreover, in each of the embodiments described above, a device to be used as the temperature sensor 48-Cc is not specifically mentioned.

However, any of a contact-type temperature sensor, a resistance-type temperature sensor, and a thermal-expansion-type temperature sensor may be used as this device as long as it is capable of measuring the temperature of a desired place with precision and at a sufficient speed, and moreover, a non-contact-type temperature sensor such as a monochromatic radiation thermometer which measures the temperature of a desired place without having any direct thermal coupling with the place may be used.

Figure 11A:
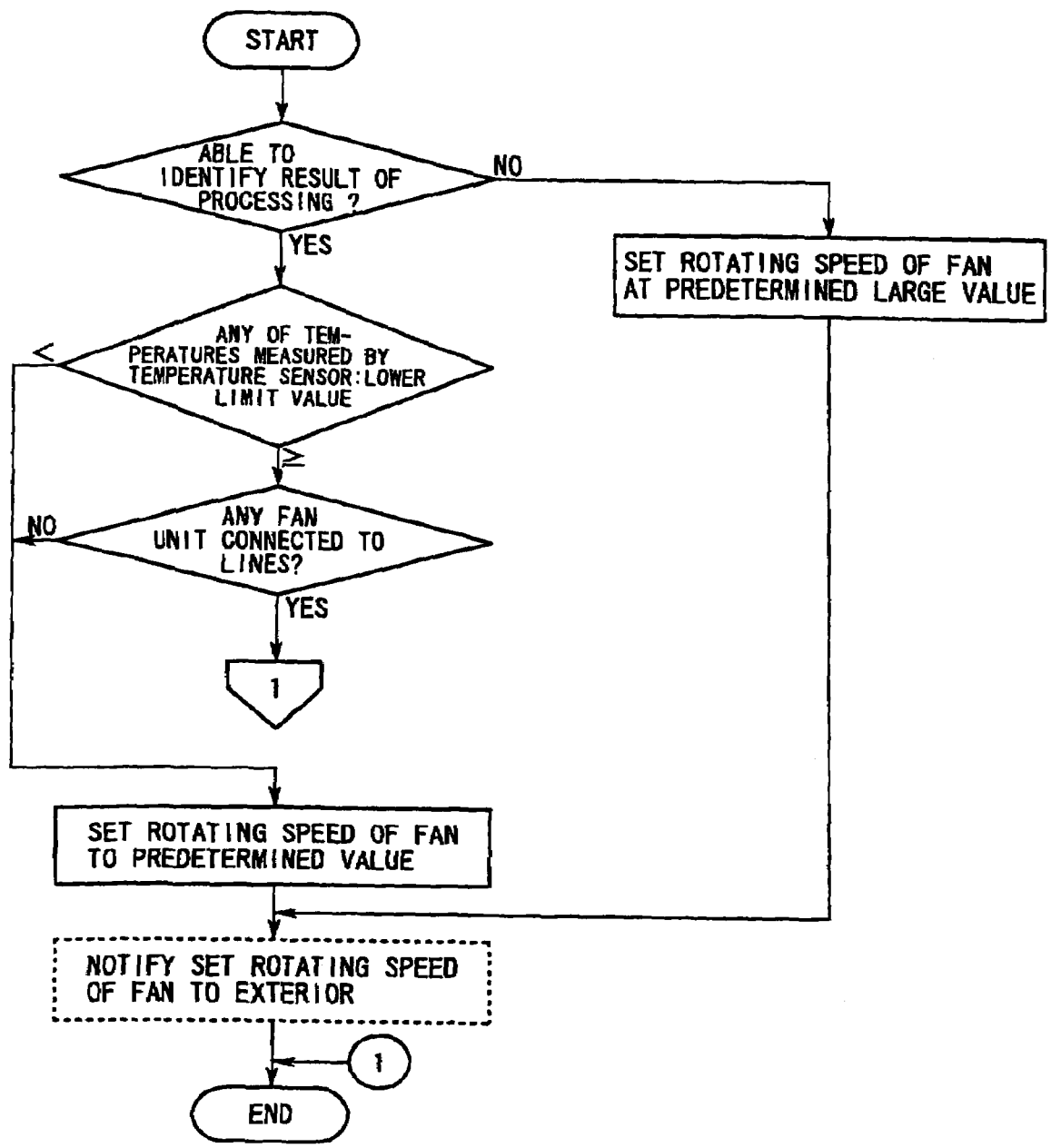
FIGS. 11(a) and (b) are flow charts showing the main characteristics in the process performed in the present invention.
Figure 11B:
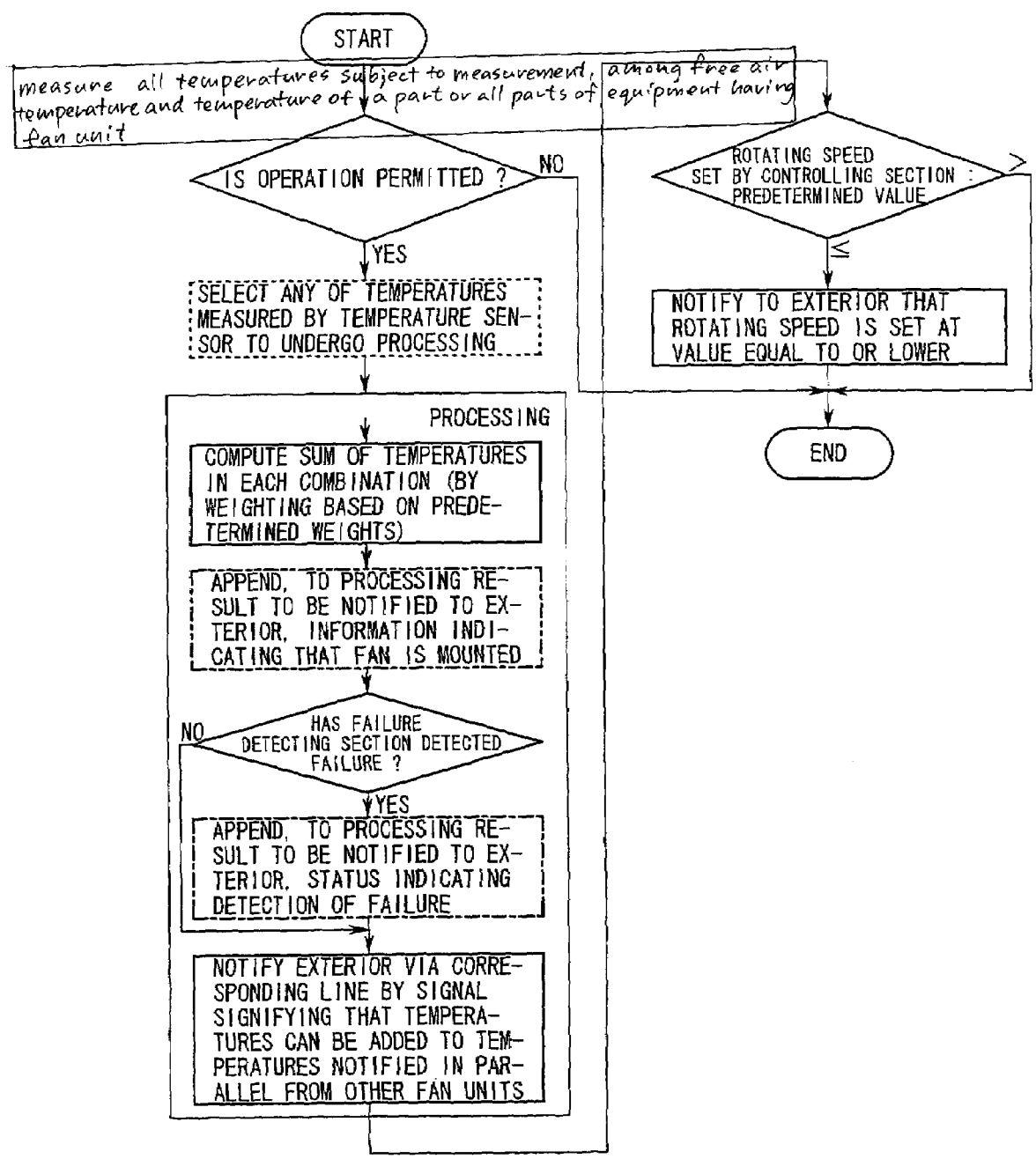

FIG. 11(*a*) is a flow chart showing the operation of the controlling section in the present invention.

FIG. 11(*b*) is a flow chart showing the operation of the broadcasting section in the present invention.

The invention is not limited to the above embodiments and various modifications may be made without departing from the spirit and the scope of the invention. Any improvement may be made in part or all of the components.

What is claimed is:

1. A motherboard comprising:
a the plurality of fan units individually having formed therein a fan, a member fixing a the fan, a thermometry section measuring temperature(s) of a single part or all parts of an equipment, a broadcasting section processing the temperatures measured for a number n of parts of the equipment and then notifying a result of the processing to an exterior through lines in units in multiples of a number n, the number n equal to or smaller than a total number of parts that are measured temperatures by a temperature sensor including at least said thermometry section, a number of the lines being equal to or smaller than n, a controlling section maintaining a rotating speed of the fan at a value determined in advance correspondingly to a processing result notified from the exterior via said lines, a DC circuit outputting whether or not the rotating speed of the fan became lower than a predetermined value, and a second controlling section increasing the rotating speed of the fan according to the condition of the DC circuit:
a first wiring forming lines that serially connect, through all said plurality of fan units, each of said DC circuit individually provided in each of said plurality of fan units; and
a second wiring formed as a wiring pattern together with said first wiring and corresponding to a bus-shaped line, connecting a part or all of a specific broadcasting section among broadcasting sections individually provided in each of the plurality of fan units, with controlling sections individually provided in all of said plurality of fan units.

2. A motherboard comprising:
a plurality of fan units individually having formed therein a fan, a member fixing the fan, a thermometry section measuring temperature(s) of a single part or a plurality of parts of an equipment, a broadcasting section processing the temperatures measured for a number n of parts of the equipment and then notifying a result of the processing to an exterior through lines in units in multiples of a number n, the number n equal to or smaller than a total number of parts that are measured temperatures by a temperature sensor including at least said thermometry section, a number of the lines being equal to or smaller than n, a controlling section maintaining a rotating speed of the fan at a value determined in advance correspondingly to a processing result notified from the exterior via said lines, a DC circuit outputting whether or not the rotating speed of the fan became lower than a predetermined value, and a second controlling section increasing the rotating speed of the fan according to the condition of the DC circuit:
a first wiring forming lines that serially connect, through all said plurality of fan units, each of said DC circuit individually provided in each of said plurality of fan units;

second wiring formed as a wiring pattern together with said first wiring and corresponding to a bus-shaped line, connecting a part or all of a specific broadcasting section among broadcasting sections individually provided in each of the plurality of fan units, with controlling section(s) individually provided in the fan units; and a connector element selecting one broadcasting section to be connected with said second wiring.

3. The motherboard according to claim 1, wherein said second wiring includes wiring connecting the motherboard with a thermometry section which is not provided in any of the plurality of fan units.

4. The motherboard according to claim 2, wherein said second wiring includes wiring connecting the motherboard with a thermometry section which is not provided in any of the plurality of fan units.

5. An electronic equipment, comprising:

a plurality of fan units cooperating with one another via wiring laid in a bus shape, the plurality of fan units individually having formed therein a fan, a member fixing the fan, a thermometry section measuring temperature(s) of a single part or a plurality of parts of an equipment, a broadcasting section processing the temperatures measured for a number n of parts of the equipment and then notifying a result of the processing to an exterior through lines in units in multiples of a number n, the number n equal to or smaller than a total number of parts that are measured temperatures by a temperature sensor including at least said thermometry section, a number of the lines being equal to or smaller than n, a controlling section maintaining a rotating speed of the fan at a value determined in advance correspondingly to a processing result notified from the exterior via said lines, a DC circuit outputting whether or not the rotating speed of the fan became lower than a predetermined value, and a second controlling section increasing the rotating speed of the fan according to the condition of the DC circuit:

a first wiring forming lines that serially connect, through all said plurality of fan units, each of said DC circuit individually provided in each of said plurality of fan units; and an electronic circuit having a predetermined function and being forcedly air-cooled by all or a part of said plurality of fan units.

6. An electronic equipment, comprising:

a single fan unit or a plurality of fan units cooperating with one another via wiring laid in a bus shape, the single fan unit or a plurality of fan units individually having formed therein a fan, a member fixing the fan, a thermometry section measuring temperature(s) of a single part or a plurality of parts of an equipment, a broadcasting section processing the temperatures measured for a number n of parts of the equipment and then notifying a result of the processing to an exterior through lines in units in multiples of a number n, the number n equal to or smaller than a total number of parts that are measured temperatures by a temperature sensor including at least said thermometry section, a number of the lines being equal to or smaller than n, a controlling section maintaining a rotating speed of the fan at a value determined in advance correspondingly to a processing result notified from the exterior via said lines, a DC circuit outputting whether or not the rotating speed of the fan became lower than a predetermined value, and a second controlling section increasing the rotating speed of the fan according to the condition of the DC circuit:

a first wiring forming lines that serially connect, through all said plurality of fan units, each of said DC circuit individually provided in each of said plurality of fan units;

an electronic circuit having a predetermined function and being forcedly air-cooled by said single fan unit or all or a part of said plurality of fan units;

an additional thermometry section measuring all or a part of temperature(s) of the interior of a case in which said single fan unit or said plurality of fan units and said electronic circuit are disposed, the exterior of the case, and an electronic device provided in said electronic circuit; and an additional broadcasting section processing in units of the number n measured temperatures and cooperating via the wiring with broadcasting sections individually provided in said fan units, the number n equal to or smaller than a number of all of the temperatures measured by said additional thermometry section, the number of the lines being equal to or smaller than n.

* * * * *